US007466166B2

(12) United States Patent
Date et al.

(10) Patent No.: US 7,466,166 B2
(45) Date of Patent: Dec. 16, 2008

(54) CURRENT DRIVER

(75) Inventors: Yoshito Date, Shiga (JP); Akira Matsuzawa, Tokyo (JP)

(73) Assignee: Panasonic Corporation, Osaka (JP)

( * ) Notice: Subject to any disclaimer, the term of this patent is extended or adjusted under 35 U.S.C. 154(b) by 67 days.

(21) Appl. No.: 11/097,341

(22) Filed: Apr. 4, 2005

(65) Prior Publication Data

US 2005/0231241 A1 Oct. 20, 2005

(30) Foreign Application Priority Data

Apr. 20, 2004 (JP) ............................ 2004-124306

(51) Int. Cl.
*H03B 1/00* (2006.01)
*H03K 3/00* (2006.01)

(52) U.S. Cl. ......................... 327/108; 327/543; 345/76; 345/204

(58) Field of Classification Search ................. 327/538, 327/108, 543; 345/76, 204
See application file for complete search history.

(56) References Cited

U.S. PATENT DOCUMENTS 6,229,382 B1 5/2001 Kojima
6,650,060 B2 11/2003 Okuda
6,756,738 B2 6/2004 Maede et al.
6,963,336 B2 * 11/2005 Kimura ...................... 345/204
6,982,687 B2 * 1/2006 Kim et al. ...................... 345/76
2004/0100427 A1 * 5/2004 Miyazawa ................... 345/76
2004/0113873 A1 * 6/2004 Shirasaki et al. .............. 345/76
2004/0155841 A1 * 8/2004 Kasai .......................... 345/76
2004/0263437 A1 * 12/2004 Hattori ........................ 345/76
2005/0156917 A1 * 7/2005 Tobita ........................ 345/204
2006/0226892 A1 * 10/2006 Moro et al. ................. 327/538
2007/0146251 A1 * 6/2007 Tsuge et al. .................. 345/76

FOREIGN PATENT DOCUMENTS

JP 11-338561 12/1999
JP 11-340765 12/1999
WO WO 2004/003877 A2 1/2004

OTHER PUBLICATIONS

Chinese Office Action, with English translation issued in Chinese Patent Application No. CN 200510066091.X dated on May 30, 2008.

* cited by examiner

*Primary Examiner*—Quan Tra
(74) *Attorney, Agent, or Firm*—McDermott Will & Emery LLP

(57) ABSTRACT

A current driver generates an output current according to an input signal. The current driver includes R current copy circuits and an output current generator where R is a natural number. Each of the current copy circuits stores a current having a given current value and input from the outside in a storage mode and outputs the stored current in an output mode. The output current generator obtains a current or the sum of currents from a non-negative integer number of the current copy circuits selected in accordance with the input signal, and thereby generates an output current.

10 Claims, 25 Drawing Sheets

CURRENT DRIVER

CROSS-REFERENCE TO RELATED APPLICATION

The disclosure of Japanese Patent Application No. 2004-124306 filed on Apr. 20, 2004 including specification, drawings and claims is incorporated herein by reference in its entirety.

BACKGROUND OF THE INVENTION

The present invention relates to current drivers and particularly to current drivers suitable as display drivers for organic EL (electro luminescence) panels, LED (light emitting diode) panels and the like.

In recent years, flat panel displays have their screen sizes and definitions increased while having their thicknesses, weights and production costs reduced. In this situation, display drivers have been required to enhance uniformity in display quality by reducing variation in output currents between output terminals. Current variation occurring during static operation of a current mirror is due to variation occurring in diffusion processes for individual transistors and variation in gate voltage caused by resistances of power lines, for example. Current variation occurring during dynamic operation of a current mirror is due to injection of charge from a display panel or instantaneous variation of power, for example. A driver semiconductor generally has a multiple-output configuration and is in the shape of a slender rod in order to be mounted in a frame portion of a flat panel. Because of this constraint on the LSI shape, characteristics of output transistors arranged on the driver semiconductor differ from one another depending on their positions on the slender layout of the driver semiconductor. Accordingly, even when the same gate voltage is applied to the output transistors, output currents from respective current mode D/A converters are not always the same.

SUMMARY OF THE INVENTION

As a method for reducing such variations, the present inventors proposed a current driver described below. FIG. 25A illustrates an overall configuration of this current driver.

The current driver includes: current mode D/A converters 1401 through 1404; bias circuits 1429 and 1420; a bias p-transistor 1423; and a current source 1424.

The current mode D/A converters 1401 through 1404 are connected to a common gate line 1411.

The bias circuit 1419 includes: a p-transistor 1421 and an n-transistor 1422. The gate of the p-transistor 1421 is connected to the gate and drain of the bias p-transistor 1423.

The bias p-transistor 1423 has its gate and drain connected to each other and its source connected to the current source 1424. The bias p-transistor 1423 draws a current which has been set at an arbitrary current value by the current source 1424. Since the gate and drain of the bias p-transistor 1423 are short-circuited, the bias p-transistor 1423 operates as a MOS diode. Accordingly, a gate voltage according to the current value of the current from the current source 1424 is generated at the gate of the bias p-transistor 1423.

The bias p-transistor 1423 and the p-transistor 1421 form a so-called “current mirror”. Accordingly, a current according to the gate-size ratio between the p-transistor 1423 and the p-transistor 1421 flows in the p-transistor 1421. That is, a current according to the arbitrary current value by the current source 1424 flows in the p-transistor 1421.

The n-transistor 1422 receives a current flowing in the p-transistor 1421. The n-transistor 1422 has its drain and gate connected to each other and its source grounded. In this manner, the n-transistor 1422 has an nMOS diode configuration. Accordingly, a gate voltage (bias voltage) according to the current input to the n-transistor 1422 is generated at the gate of the n-transistor 1422.

In this manner, the bias circuit 1419 generates a bias voltage to be supplied to the gate line 1411.

Each of the current mode D/A converters 1401 through 1404 includes: output n-transistors 1405 through 1410; switches 1412 through 1417; and a signal output terminal 1418 (see FIG. 25B.) The gates of the output n-transistors 1405 through 1410 are connected to the gate of the n-transistor 1422. Accordingly, a bias voltage applied to the gate line 1411 is supplied to the gates of the output n-transistors 1405 through 1410.

The gate line 1411 is also connected to the other bias circuit 1420 different from the bias circuit 1419.

The bias circuit 1420 includes: a p-transistor 1425; and an n-transistor 1426. The gate of the p-transistor 1425 is connected to the gate of the bias p-transistor 1423 and the gate of the p-transistor 1421.

The bias p-transistor 1423 and the p-transistor 1425 form a so-called “current mirror”. Accordingly, a current according to the gate-size ratio between the p-transistor 1423 and the p-transistor 1425 flows in the p-transistor 1425. That is, a current according to the arbitrary current value set by the current source 1424 flows in the p-transistor 1425.

The n-transistor 1426 receives the current flowing in the p-transistor 1425. The n-transistor 1426 has its drain and gate connected to each other and its source grounded. In this manner, the n-transistor 1426 has an nMOS diode configuration. Accordingly, a gate voltage (bias voltage) according to the current input to the n-transistor 1426 is generated at the gate of the n-transistor 1426. The gate of the n-transistor 1426 is connected to the gates of the output n-transistors 1405 through 1410 included in each of the current mode D/A converters 1401 through 1404 (see FIG. 25B.)

As described above, the bias circuit 1420 is substantially the same as the bias circuit 1419. Specifically, the bias circuit 1419 and the bias circuit 1420 are connected in parallel at the respective both ends of the gate line 1411. When a bias current is supplied to both ends of the slender layout (the n-transistors 1422 and 1426), variation in characteristics among the output n-transistors connected to the gate line 1411 and the potential gradient of the gate line 1411 are canceled by each other. In this manner, the current driver has an object of making the values of currents generated in the respective n-transistors connected to the gate line 1411 uniform.

FIG. 25B illustrates an internal configuration of the current mode D/A converters 1401 through 1404. The output n-transistors 1405 through 1410 output a constant current according to a bias voltage applied to the gate line 1411. Each of the switches 1412 through 1417 is connected between an associated one of the drain terminals of the output n-transistors 1405 through 1410 and the signal output terminal 1418. Each of the current mode D/A converters 1401 through 1404 outputs a current corresponding to one output by opening and closing the switches 1412 through 1417.

This arbitrary opening and closing of each of the switches 1412 through 1417 enables an associated one of the current mode D/A converters 1401 through 1404 to output a current having an arbitrary value.

In addition, the current driver is configured as a single semiconductor LSI. Though the configuration for only four outputs is shown in FIG. 25A, current mode D/A converters corresponding to 400 to 600 outputs can be provided on the same semiconductor (i.e., one current driver) as the number of outputs of the current driver increases. On the other hand, a plurality of such semiconductor LSIs (current drivers) provided with current mode D/A converters are used to output a large number of output currents to a flat panel display with a large screen in some cases.

Now, the case of using a plurality of semiconductor LSIs will be described. In this case, the plurality of semiconductor LSIs (two semiconductor LSIs in this case) are arranged in series in a frame portion of a flat panel.

One of the current drivers used as a master additionally includes: a p-transistor 1427; and a reference current output terminal 1430. The p-transistor 1427 is placed near the p-transistor 1425 in the bias circuit 1420. The bias circuit 1420 is placed near a portion at which two semiconductor LSIs are connected to each other (e.g., an edge of a semiconductor LSI.) The p-transistor 1427 has the same gate size as the p-transistor 1425. The gate of the p-transistor 1427 is connected to the bias p-transistor 1423. The source of the p-transistor 1427 is connected to a power supply similar to a power supply connected to the source of the p-transistor 1425. With this configuration, the connection relationship between the bias p-transistor 1423 and the p-transistor 1427 is the same as that of the current mirror formed by the bias p-transistor 1423 and the p-transistor 1425. That is, if the drain voltages of the respective p-transistors 1425 and 1427 are the same, the same current flows in the p-transistors 1425 and 1427. A current flowing in the p-transistor 1427 is output via the reference current output terminal 1430.

The other current driver used as a slave includes a reference current input terminal 1431 and a bias n-transistor 1428, instead of the current source 1424. The other part of the configuration thereof is the same as that of the master. The reference current input terminal 1431 is connected to the reference current output terminal 1430 of the semiconductor LSI at the previous stage (i.e., the master in this case.) The bias n-transistor 1428 receives a current from the reference current input terminal 1431. The gate of the bias n-transistor 1428 is connected to the gate of the current mode D/A converter 1429. The current mode D/A converter 1429 has the same configuration as those of the current mode D/A converters 1401 through 1404.

The adjacent semiconductor LSIs exchange currents via the p-transistor 1427, the reference current output terminal 1430, the reference current input terminal 1431 and the bias n-transistor 1428 in the manner described above, so that the same bias voltage is supplied to the plurality of current mode D/A converters. In this manner, one or a plurality of semiconductor LSIs share a common reference voltage (bias voltage), so that output currents from the respective semiconductor LSIs are made uniform.

However, this current driver is based on the premise that adjacent elements (transistors) have the same characteristics. This premise is not always true for driver LSIs with very slender shapes. For example, in this current driver, the current mode D/A converters 1401 through 1404 are arranged at transistor intervals almost corresponding to an output terminal spacing (30 through 50 μm) of the current driver. However, transistors are not always arranged close to each other, and therefore the characteristics exhibited by neighboring transistors are not obtained in some cases.

In addition, to stabilize a gate voltage supplied to the current mode D/A converters 1401 through 1404, the bias n-transistors 1422 and 1426 need to have low impedances. Accordingly, to make the bias n-transistors 1422 and 1426 have low impedances, the number of elements constituting the bias n-transistors 1422 and 1426 or the W/L ratios of the respective bias n-transistors 1422 and 1426 is increased. In this case, as compared to the output n-transistors 1405 through 1410, the area where the elements constituting the bias n-transistors 1422 and 1426 are arranged tends to be large. Accordingly, element variation between the bias n-transistors 1426 and 1428 is large between the current mode D/A converter 1404 and the current mode D/A converter 1429 at the next stage shown in FIG. 25A, so that display variation might occur at a connection point between the semiconductor LSIs.

It is an object of the present invention to provide a device in which non-uniformity of output currents is improved.

In one aspect of the present invention, a current driver generates an output current according to an input signal. The current driver includes: R current copy circuits where R is a natural number; and an output current generator. Each of the current copy circuits stores a current having a given current value and input from the outside in a storage mode and outputs the stored current in an output mode. The output current generator obtains a current or the sum of currents from a non-negative integer number of the current copy circuits selected in accordance with the input signal, and thereby generates an output current.

In the current driver, each of the current copy circuits is capable of always outputting a stable current. Accordingly, uniform output currents are obtained for the same input signal.

Each of the current copy circuits preferably includes: a MOS transistor; a capacitor; an input terminal; an output terminal; and a switch. The MOS transistor is connected between a first node and a second node. The capacitor is connected between a gate of the MOS transistor and the second node. The input terminal receives the current having the given value. The switch connects the input terminal and the first node to each other and connects the first node and the gate of the MOS transistor to each other in the storage mode. The switch also connects the output terminal and the first node to each other and disconnects the first node and the gate of the MOS transistor in the output mode.

In the current driver, the MOS transistor has its drain and gate connected to each other and thus exhibits MOS transistor characteristics in the storage mode, so that the MOS transistor causes a current having a given current value to flow as a load. At this time, a gate voltage for allowing the current having the given current value to flow is uniquely generated at the gate of the MOS transistor. Accordingly, charge according to this gate voltage is accumulated in the capacitor. In this manner, the capacitor holds a bias voltage for allowing the current having the given current value to flow. In the output mode, a gate voltage according to the charge accumulated in the capacitor is applied to the gate of the MOS transistor, so that the MOS transistor outputs a current having the same current value as a reference current from its output terminal. In this manner, the current copy circuit is not susceptible to variation of transistors as compared to a current mirror configuration, so that a stable current is always output. Voltage is likely to be affected by resistance but current is not likely to be affected by resistance. Accordingly, as compared to a current mirror generating the same amount of currents by using a common gate voltage, a current copy circuit is not likely to be affected by wiring resistance and others because the current copy circuit stores a current directly. In addition, it is easier to form capacitors having the same characteristics than to fabricate transistors having the same characteristics.

The current driver preferably further includes a control section. The control section fixes an operation mode of each of the current copy circuits at one of the storage mode and the output mode.

In this current driver, it is possible to control the operation mode of each of the current copy circuits.

The control circuit preferably fixes the operation mode of at least one of the current copy circuits at the storage mode and fixes the operation mode of each of the other current copy circuits at the output mode.

In this current driver, use of only one current having a given current value makes the current values of currents stored in all the current copy circuits uniform.

The current driver preferably further includes: an input terminal; and an output terminal. The input terminal receives the current having the given current value. The output terminal outputs a reference current input from the input terminal to the outside. Each of the current copy circuits stores the current having the given current value and received from the input terminal in the storage mode and outputs the stored current in the output mode.

In the case of this current driver, even if a plurality of such current drivers formed on different semiconductor integrated circuits are used, a common reference current (a current having a given current value) is input to current copy circuits included in the current drivers. In addition, voltage is likely to be affected by resistance but current is not likely to be affected by resistance. Accordingly, the amounts of currents stored in current copy circuits included in the current drivers are uniform. As a result, output currents from the current drivers are uniform.

A plurality of such current drivers are preferably provided and connected in series. The input terminal included in the first (foremost) one of the serially-connected current drivers receives a current having a given current value (a reference current) from the outside. The input terminal included in each of the current drivers receives a reference current from the output terminal of the current driver at its immediately preceding current driver.

The current driver preferably further includes a signal transferring section. The signal transferring section holds the input signal and outputs the input signal held therein. The output current generator obtains a current or the sum of currents from a non-negative integer number of the current copy circuits selected in accordance with the input signal from the signal transferring section, and thereby generates an output current. The control section fixes the operation mode of each of the current copy circuits at one of the storage mode and the output mode in a period during which the signal transferring section outputs no input signal.

In this current driver, the output signal generator does not perform operation (output operation) of generating an output current until an input signal is input from the signal transferring section. Accordingly, a current copy circuit stores a given current in a period during which the output current generator does not perform output operation, so that stable output operation is always achieved.

The control section preferably fixes the operation mode of at least one of the current copy circuits at the storage mode in a period during which the signal transferring section outputs no input signal.

In this current driver, if the R current copy circuits are set in the storage mode one by one in a period during which no output operation is performed, the current values of currents stored in all the current copy circuits are made uniform by using only one current having a given current value. If a plurality of current copy circuits are set in the storage mode, the time necessary for storing currents in all the current copy circuits is reduced.

The input signal preferably includes an effective data portion including effective data and an ineffective data portion including no effective data. The control section fixes the operation mode of each of the current copy circuits at one of the storage mode and the output mode while the signal transferring section holds the ineffective data portion of the input signal.

In this current driver, while the signal transferring section holds the ineffective portion of the input signal, no output is produced from the signal transferring section and therefore the output current generator performs no output operation. Accordingly, a current copy circuit stores a given current while the output current generator performs no output operation, so that stable output operation is always achieved.

The number of said current copy circuits necessary for the generation of the output current by the output current generator is preferably N at maximum where N is a natural number and N<R. The output current generator obtains a current or the sum of currents from a non-negative integer number of the current copy circuits in the output mode selected in accordance with the input signal, and thereby generates an output current.

This current driver includes (R−N) redundant current copy circuits. The output current generator identifies a current copy circuit in the output mode in accordance with the determination of the control section. Accordingly, even while the output current generator generates an output current, it is possible to set a current copy circuit in the storage mode.

The current driver preferably further includes an assignment section. The assignment section assigns, to the output current generator, N said current copy circuits in the output mode. The output current generator obtains a current or the sum of currents from a non-negative integer number of the assigned N current copy circuits selected in accordance with the input signal, and thereby generates an output current.

In this current driver, N current copy circuits are always associated with the output current generator, so that the output current generator generates an output current with stability.

The control section preferably fixes the operation mode of each of at least N said current copy circuits at the output mode.

In this current driver, current copy circuits necessary for output operation are secured.

In another aspect of the present invention, a current driver generates M output currents according to M input signals where M is a natural number. The current driver includes: M output current generators; P current copy circuits where P is a natural number; and a control section. Each of the current copy circuits stores a current having a given current value and input from the outside in a storage mode and outputs the stored current in an output mode. The control section fixes an operation mode of each of the current copy circuits at one of the storage mode and the output mode. Each of the output current generators obtains a current or the sum of currents from a non-negative integer number of the current copy circuits in the output mode selected in accordance with one of the input signals, and thereby generates an output current. The number of said current copy circuits necessary for allowing each of the output current generators to generate an output current is N at maximum where N is a natural number and N×M<R.

This current driver includes (P−N×M) redundant current copy circuits. It is possible to set a current copy circuit in the storage mode even while the output current generator generates an output current. Accordingly, a current having a given current value is stored in every current copy circuit, so that output currents from not only adjacent output current generators but also all the output current generators are made uniform.

The current driver preferably further includes an assignment section. The assignment section assigns, to each of the output current generators, N said current copy circuits in the output mode. Each of the output current generators obtains a current or the sum of currents from a non-negative integer number of the assigned N current copy circuits selected in accordance with one of the input signals, and thereby generates an output current.

In this current driver, N current copy circuits are always associated with the output current generator, so that the output current generator generates an output current with stability.

The control section preferably fixes the operation mode of each of at least N×M said current copy circuits at the output mode.

The current driver secures current copy circuits necessary for the output current generator to generate an output current.

In still another aspect of the present invention, a current driver generates M output currents according to an input signal including M input data items where M is a natural number. The current driver includes: M signal transferring sections; Q output current generators where Q is a natural number and Q>M; Q×N current copy circuits where N is a natural number; a control section; and an assignment section. Each of the signal transferring sections holds one of the input data items and outputs the input data item held therein. Each of the output current generators is associated with N said current copy circuits. Each of the Q×N current copy circuits stores a current having a given current value and input from the outside in a storage mode and outputs the stored current in an output mode. The control section fixes an operation mode of each of the Q×N current copy circuits at one of the storage mode and the output mode. The assignment section assigns, to each of the signal transferring sections, one of the output current generators associated with N said current copy circuits each of which is in the output mode. Each of the output current generators obtains a current or the sum of currents from a non-negative integer number of the associated N current copy circuits selected in accordance with the input data item from an assigned one of the signal transferring sections, and thereby generates an output current.

This current driver includes one or more redundant output current generators and one or more redundant current copy circuits. The assignment section identifies a current copy circuit in the output mode by referring to the determination of the control section. Accordingly, it is possible to set a current copy circuit in the storage mode even while the output current generator generates an output current. This makes it possible to store a current having a given current value in every current copy circuit, so that output currents generated from not only adjacent output current generators but also all the output current generators are made uniform.

The control section preferably fixes the operation modes of each of the N current copy circuits associated with each of at least M said output current generators at the output mode.

In this current driver, output current generators and current copy circuits necessary for generating an output current are secured.

In yet another aspect of the present invention, a current driver generates M output currents according to an input signal including M input data items where M is a natural number. The current driver includes: a latching instruction section; Q signal transferring sections where Q is a natural number and Q>M; Q output current generators; Q×N current copy circuits where N is a natural number; a control section; and an assignment section. The signal transferring sections are associated with the respective output current generators. Each of the output current generators is associated with N said current copy circuits. Each of the Q×N current copy circuits stores a current having a given current value and input from the outside in a storage mode and outputs the stored current in an output mode. The control section fixes an operation mode of each of the Q×N current copy circuits at one of the storage mode and the output mode. The latching instruction section outputs an instruction signal to one of the signal transferring sections associated with one of the output current generators associated with N said current copy circuits each of which is in the output mode. Each of the signal transferring sections holds one of the input data items in accordance with the instruction signal from the latching instruction section and outputs the input data items held therein. Each of the output current generators obtains a current or the sum of currents from a non-negative integer number of the associated N current copy circuits selected in accordance with an input data item from an associated one of the signal transferring sections, and thereby generates an output current.

In this current driver, the latching instruction section identifies a current copy circuit in the output mode by referring to the determination of the control section. Redundant signal transferring section, redundant output current generators and redundant current copy circuits are provided. The assignment section identifies a current copy circuit in the output mode by referring to the determination of the control section. Accordingly, it is possible to set a current copy circuit in the storage mode even while an output current generator generates an output current. This makes it possible to store a current having a given current value in every current copy circuit, so that output currents generated from not only adjacent output current generators but also all the output current generators are made uniform.

The latching instruction section preferably includes Q instruction selecting units connected in series. An instruction signal is input to one of the instruction selecting units located at the front. Each of the instruction selecting units holds an instruction signal from an immediately preceding one of the instruction selecting units associated with one of the output current generators associated with the N current copy circuits each of which is in the output mode, and outputs the instruction signal held therein.

In the current driver, each of the instruction selecting units identifies a current copy circuit in the output mode by referring to the determination of the control section. The instruction selecting units connected in series are capable of transmitting an instruction signal by bypassing an instruction selecting unit associated with an output current generator incapable of generating an output current. Accordingly, it is possible to set a current copy circuit in the storage mode even while an output current generator generates an output current.

The control section preferably fixes the operation mode of each of N said current copy circuits associated with each of at least M said output current generators at the output mode.

In this current driver, signal transferring sections, output current generators and current copy circuits necessary for generating an output current are provided. Accordingly, it is possible to set a current copy circuit in the storage mode even while an output current generator generates an output current.

In still another aspect of the present invention, a current driver generates an output current in accordance with an input signal. The current driver includes: a current copy circuit; a bias transistor; and a current mode D/A converter. The current copy circuit stores a current having a given current value and input from the outside in a storage mode and outputs the stored current in an output mode. The bias transistor outputs a bias voltage according to the current from the current copy circuit. The current mode D/A converter includes R output transistors and an output current generator where R is a natural number. Each of the output transistors outputs a current according to the bias voltage from the bias transistor. The output current generator obtains a current or the sum of currents from a non-negative integer number of the output transistors selected in accordance with the input signal, and thereby generates an output current.

In a case where all the N currents for use in generating an output current are supplied by current copy circuits, a current (a reference current) having a given current value needs to be stored in N current copy circuits. In the above current driver, each of the N output transistors and the bias transistor form a current mirror. With this configuration, each of the N output transistors outputs the same current as the reference current from the current copy circuits. Accordingly, output currents according to the same input signal are made uniform by storing the reference current in one of the current copy circuits.

The current driver preferably further includes an input terminal for receiving a current having a given current value from the outside. The current copy circuit stores the current having the given current value and received from the input terminal in the storage mode.

In the case of this current driver, even if a plurality of such current drivers formed on different semiconductor integrated circuits are used, a common reference current (a current having a given current value) is input to current copy circuits included in the current drivers. In addition, voltage is likely to be affected by resistance but current is not likely to be affected by resistance. Accordingly, the amounts of currents stored in current copy circuits included in the current drivers are uniform. As a result, output currents from the current drivers are uniform.

A plurality of such current drivers are preferably provided. The input terminals included in the respective current drivers receive a common reference current (a current having a given current value.)

Each of the current copy circuits preferably receives one of R currents input from the outside. The R currents preferably have different current values. The output current generator obtains a current or the sum of currents from a non-negative integer number of the current copy circuits selected in accordance with the input signal, and thereby generates an output current.

In this current driver, R current copy circuits store currents having different current values. For example, a current copy circuit stores a current having a current value "I" and another current copy circuit stores a current having a current value "2I". If a current value of "3I" is needed to generate an output current according to an input signal, an output current generator selects the current copy circuit storing the current having the current value of "I" and the current copy circuit storing the current having the current value of "2I". Accordingly, the output current having the current value of "3I" is generated. In this manner, currents stored in current copy circuits are appropriately selected, so that the total number of current copy circuits is reduced as compared to a case where all the current copy circuits store currents having the same current value. As a result, the time necessary for storing currents in all the current copy circuits and the circuit element area are reduced.

As described above, each current copy circuit is capable of always outputting a stable current. This makes output currents according to the same input signal uniform.

In addition, all the current copy circuits store currents having a given current value, so that output currents generated from not only adjacent output signal generators but also all the output current generators are made uniform.

DESCRIPTION OF THE PREFERRED EMBODIMENTS

Figure 1A:
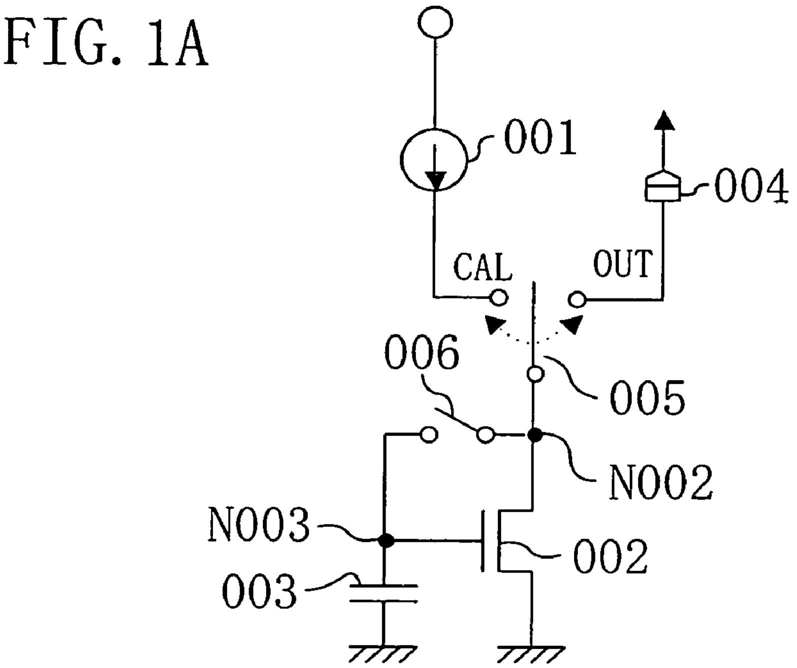
FIG. 1A illustrates a configuration of a current copy circuit (of an n-type.)

Hereinafter, embodiments of the present invention will be described in detail with reference to the drawings. The same or like components are denoted by the same reference numerals in the drawings and the descriptions thereof are not repeated.

<Current Copy Circuit>

FIG. 1A shows a configuration of a current copy circuit for use in embodiments of the present invention. This current copy circuit stores an input current in a calibration mode and outputs the stored current in an output mode. (Hereinafter, the storing of current in a current copy circuit will be hereinafter referred to as “calibration”.) The current copy circuit includes: a reference current source 001; an n-transistor 002; a capacitor 003; a current output terminal 004; and switches 005 and 006. The reference current source 001 supplies a current (a reference current) having a constant current value. The n-transistor 002 is connected between a ground node and a node N002 and has its gate connected to a node N003. The capacitor 003 is connected between a ground node and the node N003. The switch 005 connects one of the reference current source 001 and the current output terminal 004 to the node N002 according to the operation mode. The switch 006 connects the node N002 and the node N003 to each other according to the operation mode.

The capacitor 003 may be an inherent parasitic capacitance of a gate terminal of the n-transistor 002.

<<Calibration Node>>

Now, the calibration mode of the current copy circuit shown in FIG. 1A will be described.

First, the switch 005 connects the reference current source 001 and the node N002 to each other. The switch 006 connects the node N002 and the node N003 to each other. This makes the drain and gate of the n-transistor 002 short-circuited, so that a current (a reference current) having a constant current value is supplied from the reference current source 001 to the n-transistor 002.

At this time, since the drain and gate of the n-transistor 002 are connected to each other, the n-transistor 002 exhibits MOS transistor characteristics. Accordingly, the n-transistor 002 causes a reference current to flow from the reference current source 001 as a load. In this case, a gate voltage enough to cause the reference current to flow from the reference current source 001 is uniquely generated at the gate of the n-transistor 002. Accordingly, charge according to this gate voltage is accumulated in the capacitor 003. In this manner, the capacitor 003 holds a gate voltage enough to cause a current having a current value equal to that of the reference current to flow.

<<Output Mode>>

Now, the output mode of the current copy circuit shown in FIG. 1A will be described.

First, the switch 005 connects the current output terminal 004 and the node N002 to each other. The switch 006 does not connect the node N002 and the node N003 to each other. During the calibration mode described above, charge according to the gate voltage enough to cause a current having the same current value as the reference current to flow has been accumulated in the capacitor 003. Accordingly, a gate voltage according to the change accumulated in the capacitor 003 is applied to the gate of the n-transistor 002, so that connection of a power source to the current output terminal 004 allows a current having the same current value as the reference current to be drawn to the current output terminal 004.

This series of operation allows copying of a constant current and therefore is called current copying.

<<Circuit Symbols>>

Figure 1B:
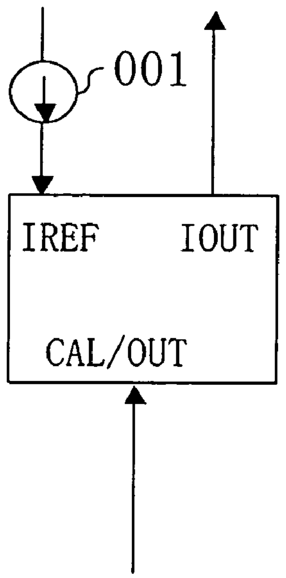
FIG. 1B shows circuit symbols of the current copy circuit illustrated in FIG. 1A.

Now, suppose the current copy circuit shown in FIG. 1A is a 3-terminal circuit element as shown in FIG. 1B. In FIG. 1B, the current copy circuit includes: a reference current input terminal IREF; a current output terminal IOUT; and a switching control terminal CAL/OUT. The reference current input terminal IREF is connected to the reference current source 001 and, in a storage mode, receives a current from the reference current source 001. The current output terminal IOUT outputs a current copied in the current copy circuit in an output mode. The expression of “to output a current” herein also includes the case of drawing a current. In this case, an output current is a current having “a negative current value”. The switching control terminal CAL/OUT switches the operation mode between the calibration mode and the output mode in accordance with a switching signal input from the outside. For example, when the switching signal input to the switching control terminal CAL/OUT is at “H” (high level), the current copy circuit is in the calibration mode whereas when the switching signal input to the switching control terminal CAL/OUT is at “L” (low level), the current copy circuit is in the output mode.

EMBODIMENT 1

<Overall Configuration>

Figure 2:
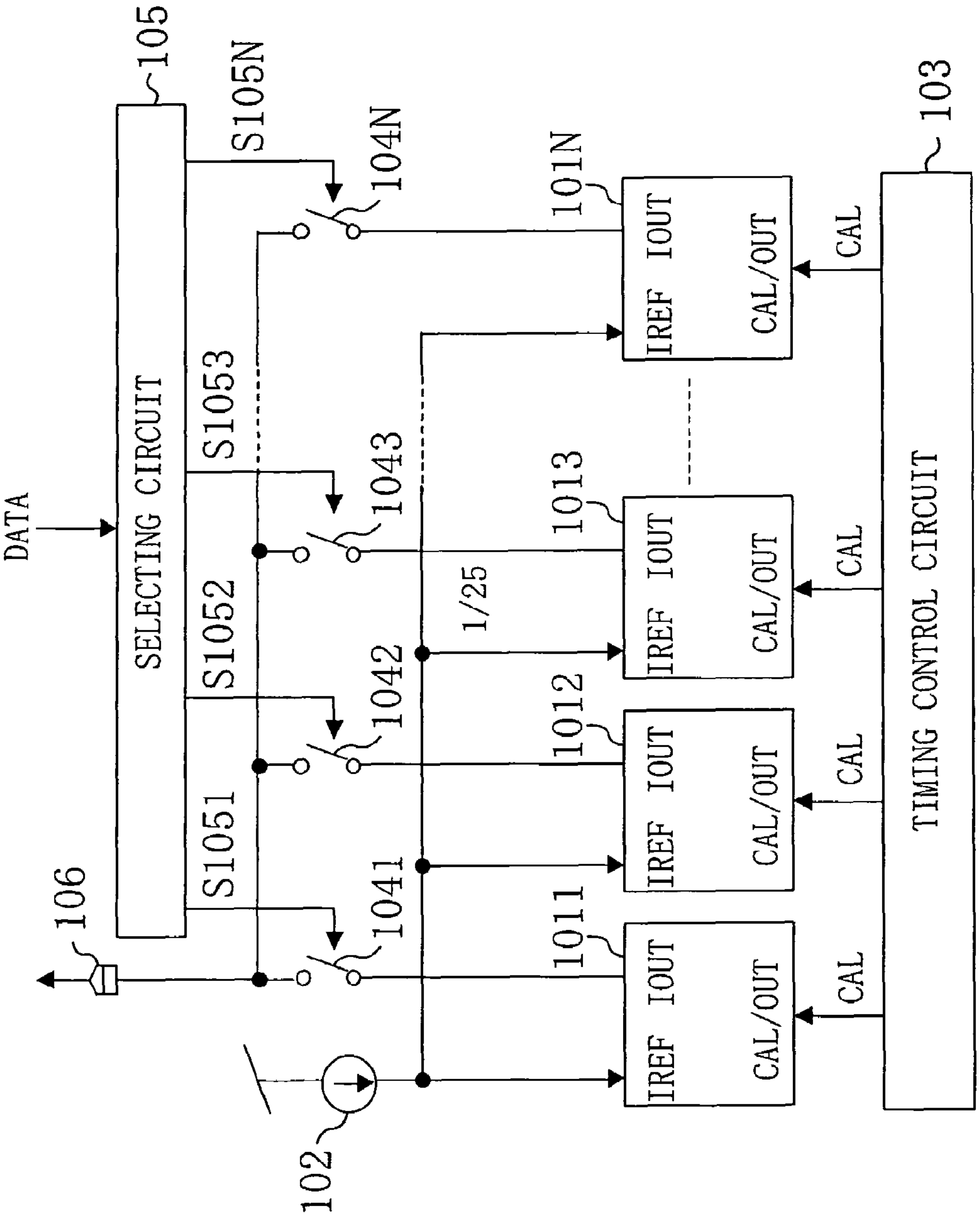
FIG. 2 is a diagram illustrating an overall configuration of a current driver according to a first embodiment of the present invention.

FIG. 2 illustrates an overall configuration of a current driver according to a first embodiment of the present invention. This current driver receives display data DATA corresponding to one pixel and produces an output current according to the received display data DATA. The current driver includes; N current copy circuits 1011 through 101N (where N is a natural number); a reference current source 102; a timing control circuit 103; N switches 1041 through 104N; a selecting circuit 105; and a signal output terminal 106. Each of the current copy circuits 1011 through 101N is the current copy circuit shown in FIG. 1B and has its reference current input terminal IREF connected to the reference current source 102, its current output terminal IOUT connected to an associated one of the switches 1041 through 104N and its switching control terminal CAL/OUT connected to the timing control circuit 103. The timing control circuit 103 outputs switching signals CAL to the respective switching control terminals CAL/OUT of the current copy circuits 1011 through 101N. The selecting circuit 105 outputs selecting signals S1051 through S105N to the switches 1041 through 104N in accordance with display data DATA input from the outside. The switches 1041 through 104N respectively connect the current output terminals IOUT of associated ones of the current copy circuits to the signal output terminal 106 in accordance with the selecting signals S1051 through S105N from the selecting circuit 105. The signal output terminal 106 obtains the sum of currents input from the current copy circuits 1011 through 101N and causes the resultant current to flow as an output current.

In the case of applying the current driver of this embodiment to an actual display panel, e.g., in the case of a quarter common intermediate format (QCIF) display panel, 176 signal output terminals 106 are needed (the number of necessary signal output terminals 106 are triple, i.e., 528, in the case of RGB), so that 176 current drivers are needed. If the number N of levels of gray scale of display data DATA is 64 (6 bits), the total number of necessary current copy circuits is $176\times(2^6-1)=176\times63=11088$.

<Calibration Mode>

A calibration mode of the current driver shown in FIG. 2 will be described. The following description is based on the assumption that no reference current is held in any of the current copy circuits 1011 through 101N and the amount of a current supplied from the reference current source 102 is enough to allow a given amount of charge to be accumulated in a capacitor included in one of the current copy circuits. That is, a current supplied from the reference current source 102 does not flow into two or more current copy circuits at a time and flows into only one current copy circuit at each time.

First, the timing control circuit 103 sets the switching signal CAL to the current copy circuit 1011 out of the current copy circuits 1011 through 101N at "H" and sets the switching signals CAL to the other current copy circuits 1012 through 101N at "L". This allows calibration to be performed on the current copy circuit 1011.

Next, the timing control circuit 103 sets the switching signal CAL to the current copy circuit 1011 at "L" and sets the switching signal CAL to the current copy circuit 1012 at "H". The switching signals CAL to the other current copy circuits 1013 through 101N are kept at "L". This allows calibration to be performed on the current copy circuit 1012.

In this manner, the switching signals CAL to the current copy circuits 1011 through 101N are switched one by one, so that calibration is sequentially performed on all the current copy circuits 1011 through 101N. When all the switching signals CAL from the timing control circuit 103 to the current copy circuits 1011 through 101N are at "L", calibration on all the current copy circuits 1011 through 101N is completed.

<Output Mode>

Now, an output mode of the current driver shown in FIG. 2 will be described.

First, the selecting circuit 105 receives display data DATA from the outside. The selecting circuit 105 outputs selecting signal S1051 through S105N to the switches 1041 through 104N in accordance with the received display data DATA. For example, suppose the display data DATA has 64 levels of gray scale (i.e., the number of current copy circuits is 63 (N=63).) Then, when the display data DATA is "00H", the selecting circuit 105 sets all the selecting signals S1051 through S105N at "L" so that all the switches 1041 through 104N are turned OFF. On the other hand, when the display data DATA is "3FH", the selecting circuit 105 sets all the selecting signals S1051 through S105N at "H" so that all the switches 1041 through 104N are turned ON. Since all the switches 1041 through 104N are ON when the display data DATA is "3FH", the signal output terminal 106 draws a large amount of current as the sum of currents output from the current copy circuits 1011 through 101N.

<Refresh>

In the case of performing calibration only one time, the reference voltage (gate voltage) according to the capacitor 003 is caused to vary by leakage at the capacitor 003 and the gate of the n-transistor 002 in each of the current copy circuits 1011 through 101N. Accordingly, calibration on the current copy circuits 1011 through 101N needs to be regularly updated (refreshed.) The principle of this operation is the same as that for dynamic RAMs.

<Advantages>

With the foregoing configuration, even a very slender driver LSI is capable of making all the current copy circuits hold a common reference current, so that the current values of output currents according to display data input to the selecting circuit are kept at constant. That is, output currents from not only adjacent terminals but also all the output terminals are set at a constant value. This enables uniform display of a display panel.

Figure 3A:
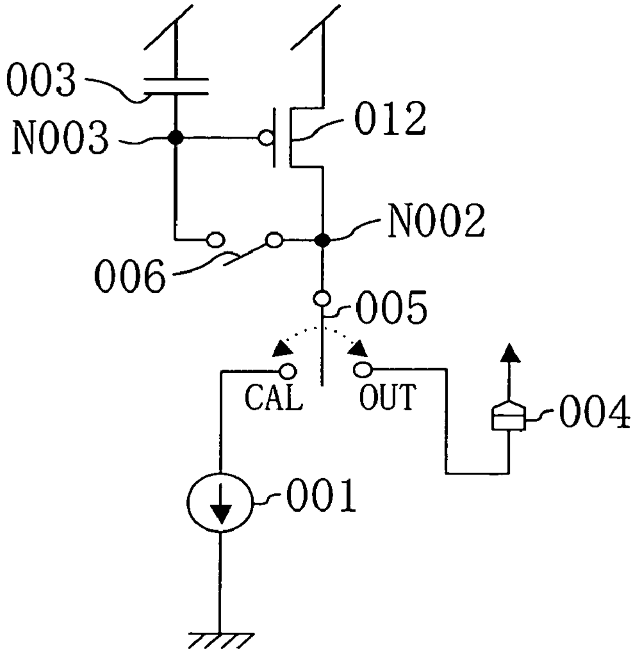
FIG. 3A illustrates a configuration of a current copy circuit (of a p-type.)
Figure 3B:
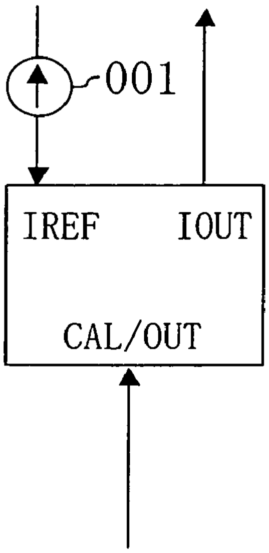
FIG. 3B shows circuit symbols of the current copy circuit illustrated in FIG. 3A.

In FIGS. 1A and 1B, n-transistors are used as components of the current copy circuits 1011 through 101N. Alternatively, p-transistors may be used. In this case, the current copy circuits 1011 through 101N are configured as shown in FIGS. 3A and 3B. The current copy circuit shown in FIG. 3A includes: a reference current source 001; a p-transistor 012; a capacitor 003; a current output terminal 004; and switches 005 and 006. The p-transistor 012 is connected between a power supply voltage terminal and a node N002 and has its gate connected to a node N003. The capacitor 003 is connected between a power supply voltage terminal and a node N003. The switch 005 connects one of the reference current source 001 and the current output terminal 004 to the node N002 according to the operation mode. The switch 006 connects the node N002 and the node N003 to each other according to the operation mode. The circuit symbols of the current copy circuit illustrated in FIG. 3A are shown in FIG. 3B.

EMBODIMENT 2

Definitions and sizes of screens of display panels have been increasing in recent years. Under this circumstance, it is difficult for a single semiconductor integrated circuit to generate output currents according to all display data items. Hence, a large number of semiconductor integrated circuits need to be used to share processes of generating output currents. In this case, it is required to send a reference current to these semiconductor integrated circuits.

<Overall Configuration>

Figure 4:
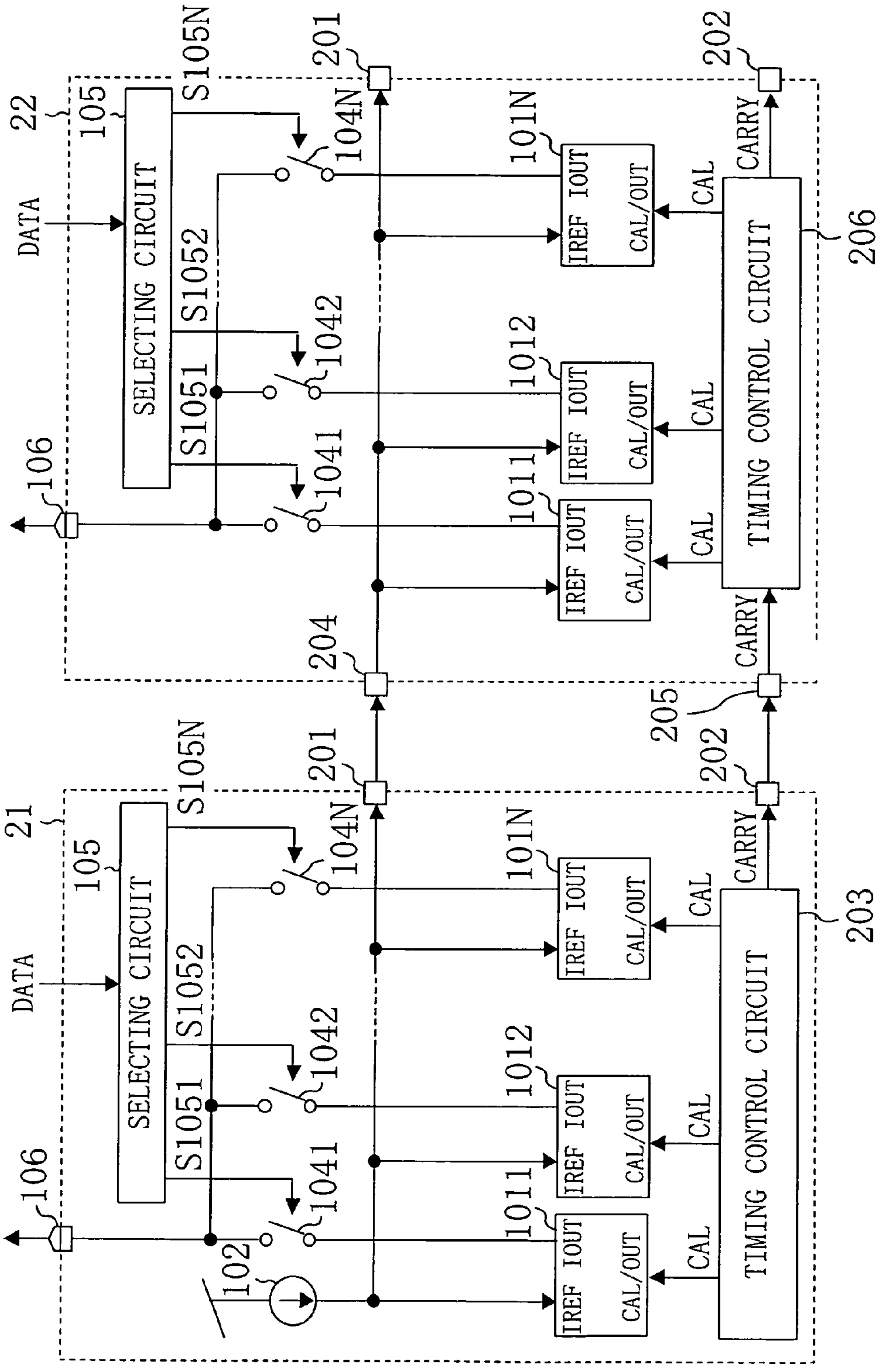
FIG. 4 is a diagram illustrating an overall configuration of a current driver according to a second embodiment of the present invention.

FIG. 4 illustrates an overall configuration of a current driver according to a second embodiment of the present invention. The current driver includes a master 21 and a slave 22. Each of the master 21 and the slave 22 is a semiconductor integrated circuit including the current copy circuits 1011 through 101N shown in FIG. 1.

<Internal Configuration of Master>

The master 21 includes a reference current output terminal 201, a carry signal output terminal 202 and a timing control circuit 203, instead of the timing control circuit 103 shown in FIG. 2. The other part of the configuration thereof is the same as that shown in FIG. 2. The reference current output terminal 201 outputs a reference current supplied from a reference current source 102 to the outside. The timing control circuit 203 outputs switching signals CAL to the current copy circuits 1011 through 101N in the order from the current copy circuit 1011. When the output of the switching signals CAL to all the current copy circuits 1011 through 101N has finished, the timing control circuit 203 outputs a carry signal CARRY to the carry signal output terminal 202. The carry signal CARRY is a flag generated when an overflow occurs in timing or a result of operation in a shift register or an adder, for example.

<Internal Configuration of Slave>

The slave 22 includes a reference current input terminal 204, a carry signal input terminal 205, a timing control circuit 206, a reference current output terminal 201 and a carry signal output terminal 202, instead of the timing control circuit 103 and the reference current source 102 shown in FIG. 2. The other part of the configuration thereof is similar to that shown in FIG. 2. The reference current input terminal 204 receives a reference current from the reference current output terminal 201 of the master 21 and supplies the received reference current to the current copy circuits 1011 through 101N and the reference current output terminal 201. The carry signal input terminal 205 receives a carry signal CARRY from the carry signal output terminal 202 of the master 21 and outputs the received carry signal CARRY to the timing control circuit 206. Upon reception of the carry signal CARRY from the carry signal input terminal 205, the timing control circuit 206 starts outputting switching signals CAL to the current copy circuits 1011 through 101N in the order from the current copy circuit 1011. When the output of the switching signals CAL to all the current copy circuits 1011 through 101N has finished, the timing control circuit 206 outputs a carry signal CARRY to the carry signal output terminal 202.

<Calibration Mode>

A calibration mode of the current driver shown in FIG. 4 will be described. It is assumed that the timing control circuit 203 outputs switching signals CAL to the current copy circuits 1011 through 101N in the order from the current copy circuit 1011 in synchronization with a given clock.

<Internal Operation of Master 21>

First, the timing control circuit 203 sets the switching signal CAL to the current copy circuit 1011 out of the current copy circuits 1011 through 101N at "H" and sets the switching signals CAL to the other current copy circuits 1012 through 101N at "L".

Next, in synchronization with a given clock, the timing control circuit 203 sets the switching signal CAL to the current copy circuit 1011 at "L" and sets the switching signal CAL to the current copy circuit 1012 at "H". The switching signals CAL to the other current copy circuits 1013 through 101N are kept at "L". In this manner, the timing control circuit 203 sequentially outputs switching signals CAL to the current copy circuits 1011 through 101N in synchronization with a given clock.

Thereafter, when the switching signal CAL to the current copy circuit 101N is at "H", the timing control circuit 203 sets this switching signal CAL at "L" and outputs a carry signal CARRY to the carry signal output terminal 202, in synchronization with a given clock.

<Internal Operation of Slave 22>

Then, when receiving the carry signal CARRY through the carry signal output terminal 202 and the carry signal input terminal 205, the timing control circuit 206 outputs a switching signal CAL to the current copy circuit 1011.

Subsequently, as the timing control circuit 203, the timing control circuit 206 sequentially outputs switching signals CAL to the current copy circuits 1012 through 101N in synchronization with a given clock.

Thereafter, when the switching signal CAL to the current copy circuit 101N is at "H", the timing control circuit 206 changes the switching signal CAL to the current copy circuit 101N to "L" and outputs a carry signal CARRY to the carry signal output terminal 202, in synchronization with a given clock.

In this manner, calibration is performed on the current copy circuits 1011 through 101N included in each of the master 21 and the slave 22 in synchronization with a given clock.

<Advantages>

As described above, a reference current is transmitted from a current driver at a first stage (a master) to the adjacent current driver at the next stage (a slave), so that a stable reference current is supplied to a plurality of current drivers (semiconductor integrated circuits.) This enables calibration to be performed on current copy circuits included in the current drivers by using a common reference current source, so that output currents from the current drivers are uniform. Accordingly, output currents are generated with stability even with a large-screen high-definition display panel.

In this embodiment, only one master and only one slave are used. Alternatively, a plurality of slaves may be connected in series at subsequent stages of a master. In such a case, it is sufficient that the reference current input terminal 204 and the carry signal input terminal 205 of each of the slaves are connected to the reference current output terminal 201 and the carry signal output terminal 202 of the slave at its immediately preceding stage.

EMBODIMENT 3

<Overall Configuration>

Figure 5:
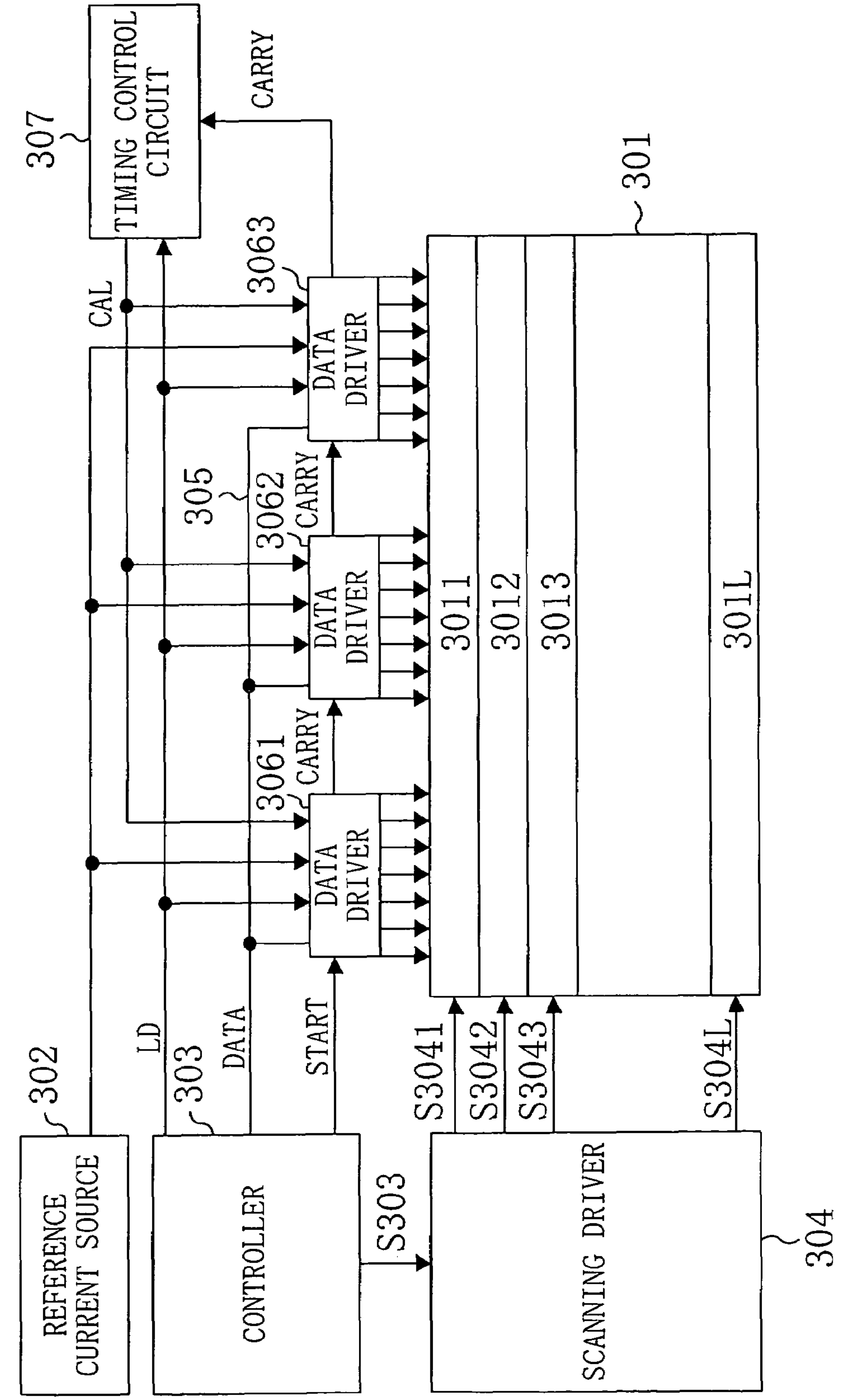
FIG. 5 is a diagram illustrating an overall configuration of a display driver according to a third embodiment of the present invention.

FIG. 5 illustrates an overall configuration of a display driver according to a third embodiment of the present invention. The display driver includes: a display panel 301; a reference current source 302; a controller 303; a scanning driver 304; a display data line 305; data drivers 3061, 3062 and 3063; and a timing control circuit 307.

The display panel 301 includes L lines 3011 through 301L. In each of the lines 3011 through 301L, a given number of current-controlled elements (e.g., organic ELs or LEDs) are arranged in series. The reference current source 302 supplies a reference current having a constant current value to the data drivers 3061, 3062 and 3063. The controller 303 outputs a load timing signal LD, a start timing signal START, display data DATA and a scanning control signal S303. The scanning driver 304 outputs scanning signals S3041 through S304L to the respective lines 3011 through 301L in accordance with the scanning control signal S303 from the controller 303. The display data line 305 transmits the display data DATA from the controller 303. The data driver 3061 holds the display data DATA transmitted through the display data line 305 in accordance with the start timing signal START from the controller 303. Then, the data driver 3061 outputs, to one of the lines 3011 through 301L to which a scanning signal has been input, a current associated with the display data DATA in accordance with the load timing signal LD from the controller 303. The data driver 3061 also outputs the start timing signal START from the controller 303 to the data driver 3062 at the next stage as a carry signal CARRY. Each of the data drivers 3062 and 3063 holds display data DATA transmitted through the display data line 305 in accordance with the carry signal CARRY from the data driver 3061 or 3062 at its immediately preceding stage. Then, each of the data drivers 3062 and 3063 outputs, to one of the lines 3011 through 301L to which a scanning signal has been input, a current associated with the display data DATA in accordance with the load timing signal LD from the controller 303. The data driver 3062 outputs a carry signal CARRY to the data driver 3063 at the next stage. The data driver 3063 outputs a carry signal CARRY to the timing control circuit 307. Current-controlled elements provided in a line to which a scanning signal has been input from the scanning driver 304 emit light in accordance with output currents from the data drivers 3061, 3062 and 3063. The timing control circuit 307 refers to the load timing signal LD from the controller 303 and the carry signal CARRY from the data driver 3063 and outputs switching signals CAL to the respective data drivers 3061, 3062 and 3063.

In the example shown in FIG. 5, only three data drivers are used. However, in the case of a large-screen high-definition display panel, a large number of drivers are needed in some cases.

<Internal Configuration of Data Driver>

Figure 6:
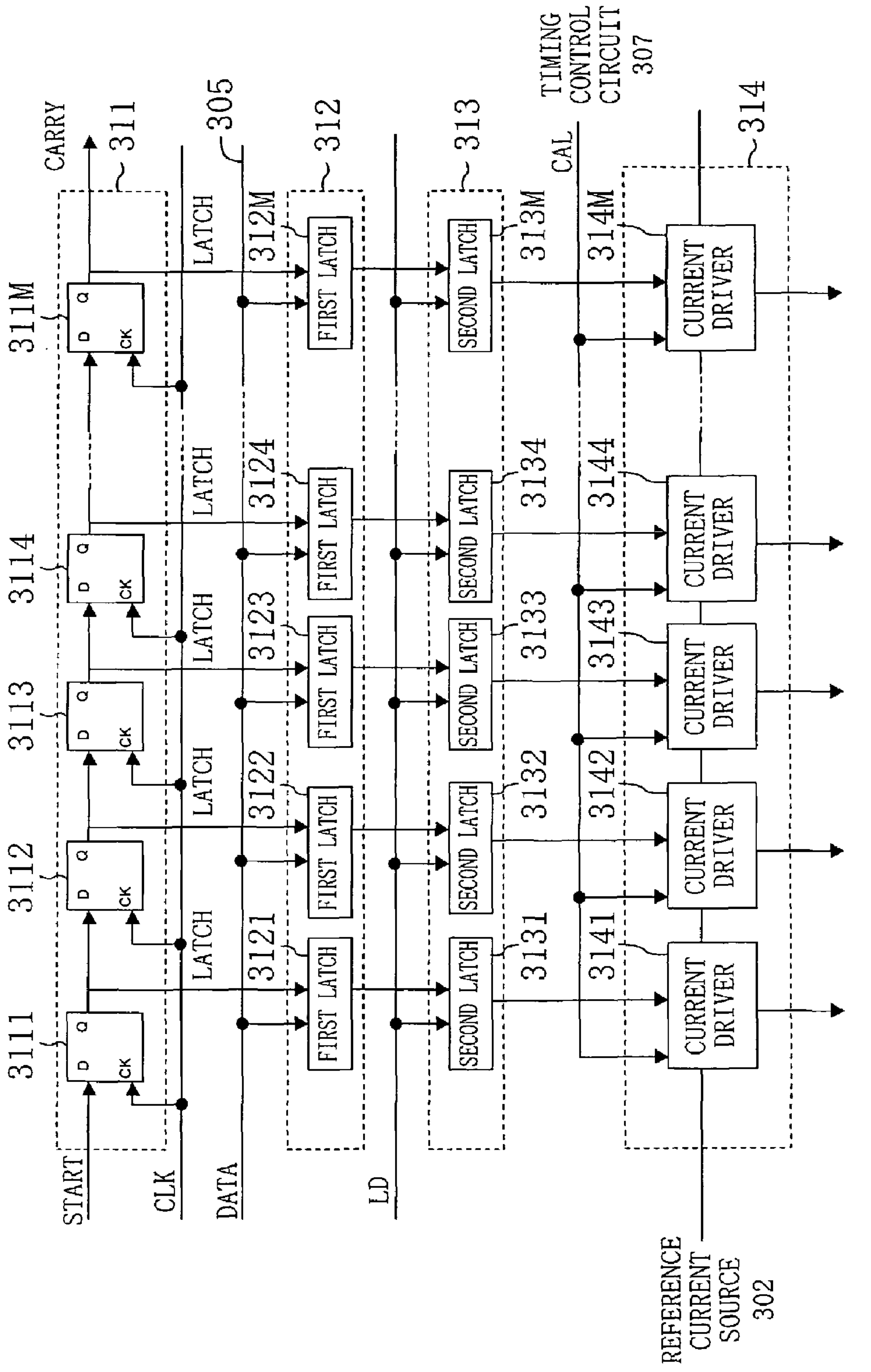
FIG. 6 is a diagram illustrating an internal configuration of the data driver shown in FIG. 5.

Internal configuration of the data drivers 3061, 3062 and 3063 shown in FIG. 5 will be hereinafter described. The data drivers 3061, 3062 and 3063 have similar configurations, and thus the internal configuration of the data driver 3061 is shown in FIG. 6 as a representative example. The data driver 3061 includes: a shift register 311; a first latch group 312; a second latch group 313; and a current driver group 314. The shift register 311 sequentially shifts a start timing signal START from the controller 303 in synchronization with a given clock CLK, thereby outputting latch timing signals LATCH to the first latch group 312. When the start timing signal START from the controller 303 reaches the end of the shift register 311, the shift register 311 outputs this start timing signal START to the data driver at the next stage as a carry signal CARRY. The first latch group 312 takes display data DATA transmitted through the display data line 305 therein and holds the display data DATA, in synchronization with the latch timing signal LATCH from the shift register 311. The second latch group 313 takes the display data DATA held by the first latch group 312 therein and outputs the display data DATA to the current driver group 314, in synchronization with the load timing signal LD from the controller 303. The current driver group 314 generates output currents according to the display data DATA from the second latch group 313 by using a reference current from the reference current source 302, and outputs the generated output currents to one of the lines 3011 through 301L of the reference current source 302. The current driver group 314 receives a switching signal CAL from the timing control circuit 307.

The data drivers 3062 and 3063 receive carry signals CARRY, instead of the start signal START.

<Internal Configurations>

Now, internal configurations of the shift register 311, the first latch group 312, the second latch group 313 and the current driver group 314 shown in FIG. 6 will be described.

The shift register 311 includes M flip-flops 3111 through 311M (where M is a natural number.) The first latch group 312 includes M first latch circuits 3121 through 312M. The second latch group 313 includes M second latch circuits 3131 through 313M. The current driver group 314 includes M current drivers 3141 through 314M. Each of the first latch circuits 3121 through 312M is connected to an associated one of the second latch circuits 3131 through 313M. Each of the second latch circuits 3131 through 313M is connected to an associated one of the current drivers 3141 through 314M.

<Circuit Relationship>

Figure 7:
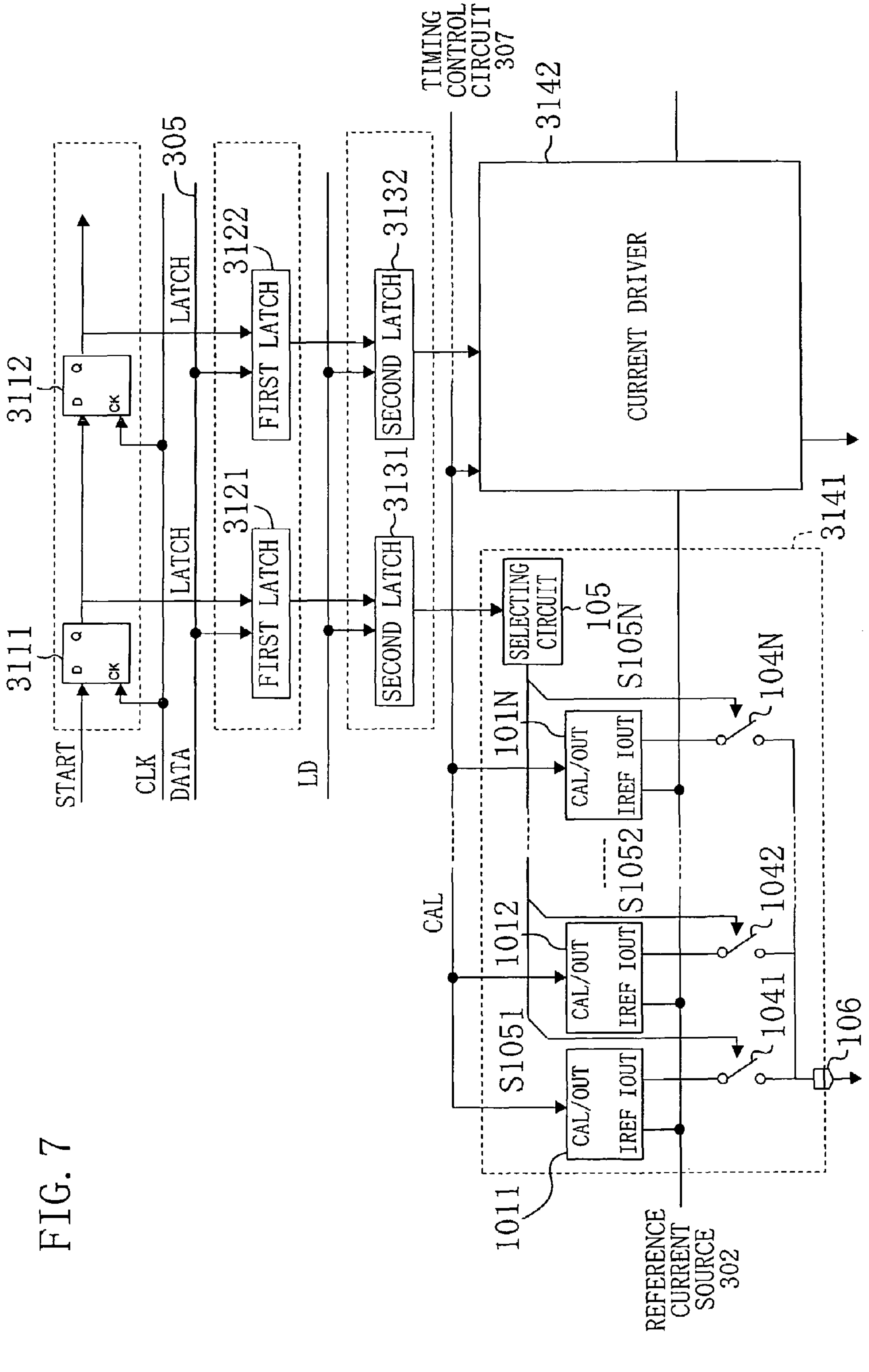
FIG. 7 is a diagram illustrating an internal configuration of the data driver shown in FIG. 5.

The flip-flop 3111, the first latch circuit 3121, the second latch circuit 3131 and the current driver 3141 will be described with reference to FIG. 7 as representative examples.

The flip-flop 3111 holds a start timing signal START input from the outside and outputs this start timing signal START to the first latch circuit 3121 as a latch timing signal LATCH, in synchronization with a given clock CLK. The first latch circuit 3121 and the second latch circuit 3131 are capable of holding display data DATA corresponding to one pixel. The current driver 3141 has a configuration similar to that of the current driver shown in FIG. 2 and includes: a selecting circuit 105; current copy circuits 1011 through 101N; switches 1041 through 104N; and a signal output terminal 106.

The first latch circuit 3121 takes a display data item DATA transmitted on the display data line 305 corresponding to one pixel (hereinafter, referred to as a one-pixel data item) and holds this data item, in synchronization with the latch timing signal LATCH from the flip-flop 3111. The second latch circuit 3131 takes the one-pixel data item DATA held by the first latch circuit 3121 and outputs the one-pixel data item DATA to the selecting circuit 105 included in the current driver 3141, in synchronization with the load timing signal LD from the controller 303. The selecting circuit 105 included in the current driver 3141 outputs selecting signals S1051 through S105N to the switches 1041 through 104N, in accordance with the one-pixel data item DATA from the second latch circuit 3131. The signal output terminal 106 obtains the sum of all the currents input from the current copy circuits 1011 through 101N and outputs the resultant current to selected current-controlled elements as an output current. The current copy circuits 1011 through 101N included in the current driver 3141 receive switching signals CAL from the timing control circuit 307.

<Operation>

The operation mode of the display driver shown in FIG. 5 includes an image display mode in which an image according to display data DATA is displayed on the display panel 301 and a calibration mode in which calibration is performed on the current copy circuits 1011 through 101N included in each of the current drivers 3141 through 314N.

<<Image Display Mode>>

Figure 8:
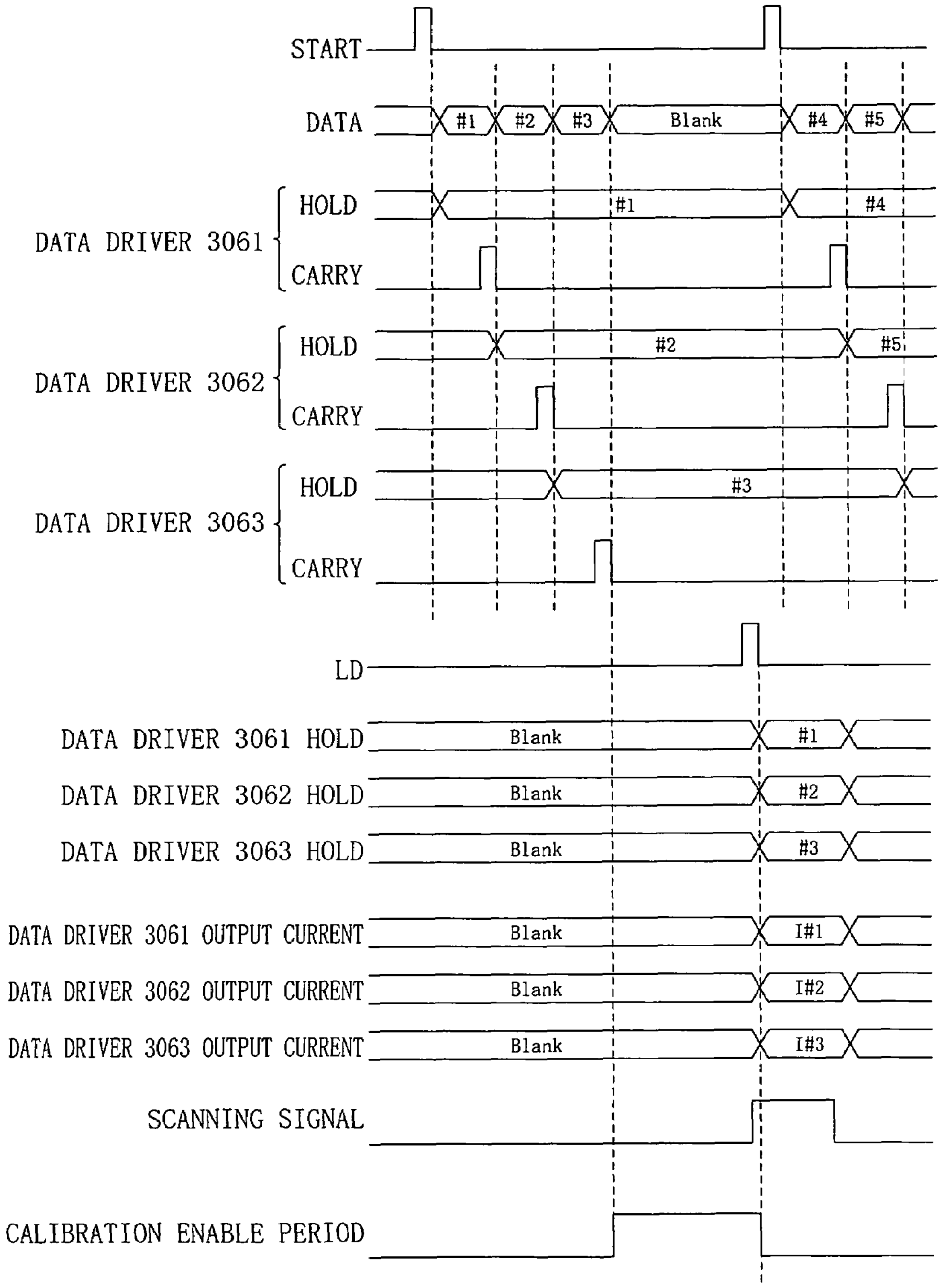
FIG. 8 is timing charts showing operation of the display driver shown in FIG. 5.

Now, the image display mode will be described with reference to FIG. 8. In FIG. 8, the start timing signals START is output twice. This means that display data DATA corresponding to two lines is transferred. In the case of an actual display, a start timing signal START is generally output in a number of times corresponding to "the number of scanning lines+the number of retrace lines" for display corresponding to one panel.

First, the controller 303 outputs a start timing signal START to the data driver 3061. In the data driver 3061, the shift register 311 sequentially shifts the start timing signal START from the controller 303, thereby outputting latch timing signals LATCH to the first latch group 312.

For one start timing signal START, the controller 303 outputs display data DATA (display data items #1, #2 and #3) corresponding to one line to the display data line 305. At this time, the controller 303 outputs the display data DATA to the display data line 305 slightly after outputting the start timing signal START.

Next, in the data driver 3061, the first latch group 312 holds the display data item #1 transmitted on the display data line 305, in synchronization with the latch timing signal LATCH from the shift register 311. Thereafter, the shift register 311 included in the data driver 3061 outputs a carry signal CARRY to the data driver 3062.

Then, in the data driver 3062, the shift register 311 sequentially shifts the carry signal CARRY from the data driver

3061, thereby outputting latch timing signals LATCH to the first latch group 312. Subsequently, in the data driver 3062, the first latch group 312 holds the display data item #2 transmitted on the display data line 305 in synchronization with the latch timing signals LATCH from the shift register 311. Thereafter, the shift register 311 included in the data driver 3062 outputs a carry signal CARRY to the data driver 3063.

Subsequently, in the data driver 3063, the same operation as in the data driver 3062 is carried out, and the first latch group 312 holds the display data item #3. Then, the shift register 311 included in the data driver 3063 outputs a carry signals CARRY to the timing control circuit 307.

In this manner, the display data items #1, #2 and #3 are held by the first latch groups 312 in the data drivers 3061, 3062 and 3063.

Thereafter, when the first latch group 312 included in the data driver 3063 holds the display data item #3, a blanking period Blank starts and continues until the next start timing signal START is input from the controller 303. One blanking period is present in display DATA corresponding to one line. In the case of a CRT display, a blanking period Blank is used as a period for retrace of a scanning line. In liquid crystal displays and organic EL panels, the blanking period Blank has been decreasing. However, in general, an arbitrary blanking period Blank is still set in consideration of the timing of inputting display data DATA to the controller 303 and the other control circuits.

On the other hand, the scanning driver 304 outputs scanning signals S3041 through S304L to the respective lines 3011 through 301L of the display panel 301 one by one, in accordance with the scanning control signal S303 from the controller 303. For example, the scanning driver 304 outputs the scanning signals S3041 through S304L to the lines 3011 through 301L in the order from the first line 3011. Current-controlled elements provided in a line to which the scanning signal has been input receive output currents from the data drivers 3061, 3062 and 3063.

Then, the controller 303 outputs a load timing signal LD to the second latch groups 313 included in the data drivers 3061, 3062 and 3063. Each of the second latch groups 313 included in the data drivers 3061, 3062 and 3063 takes display data item #1, #2 or #3 held in the associated one of the first latch groups 312, in synchronization with the load timing signal LD from the controller 303. Concurrently with the time when the second latch groups 313 take the display data items #1, #2 and #3 therein, all the current driver groups 314 start their operation at a time and output currents I#1, I#2 and I#3 according to the display data items #1, #2 and #3, respectively, to one of the lines 3011 through 301L of the display panel 301 to which the scanning signal from the scanning driver 304 has been input.

In this manner, the output currents I#1, I#2 and I#3 from the data drivers 3061, 3062 and 3063 are input to current-controlled elements provided in a line to which a scanning signal has been input, so that an image according to display data DATA corresponding to one line is displayed. If the foregoing operation is performed on all the lines in order, an image according to display data DATA corresponding to one frame is displayed.

<<Calibration Mode>>

Now, a calibration mode of the display driver shown in FIG. 5 will be described with reference to FIG. 8. The display driver performs calibration on current copy circuits 1011 through 101N during a blanking period.

First, when the first latch groups 312 in the data drivers 3061, 3062 and 3063 hold display data items #1, #2 and #3, the shift register 311 included in the data driver 3063 outputs a carry signal CARRY to the timing control circuit 307.

Next, upon reception of the carry signal CARRY from the data driver 3063, the timing control circuit 307 starts outputting switching signals CAL to current copy circuits (i.e., a total of N×M current copy circuits) included in each of the data drivers 3061, 3062 and 3063.

Then, upon reception of a load timing signal LD from the controller 303, the timing control circuit 307 stops outputting the switching signals CAL to the current copy circuits (i.e., a total of N×M current copy circuits) included in each of the data drivers 3061, 3062 and 3063.

In this manner, the timing control circuit 307 holds a period during which calibration is enabled (calibration enable period), by referring to the load timing signal LD and the carry signal CARRY.

<Advantages>

As described above, the timing control circuit holds the calibration enable period in a blanking period, so that calibration is carried out normally without display irregularities on a display panel. The reason why no display irregularities occurs is because the output from the scanning driver is set at "L" and display data DATA is held in display pixels before the blanking period starts.

The display driver of this embodiment includes only three data drivers. Alternatively, four or more data drivers may be provided. In such a case, it is sufficient that the data driver at the first stage receives a start timing signal from the controller 303 and the timing control circuit 307 receives a carry signal from the data driver at the last stage.

EMBODIMENT 4

<Overall Configuration>

An overall configuration of a display driver according to a fourth embodiment of the present invention is similar to that of the third embodiment. In the display driver of this embodiment, calibration is performed on one of current copy circuits during a blanking period.

<Calibration Mode>

Operation of the display driver of the fourth embodiment will be described. In this embodiment, out of data drivers 3061, 3062 and 3063 included in the display driver, only the data driver 3061 is driven and the data driver 3061 includes a total of 11088 current copy circuits.

<<Calibration 1>>

Figure 9:
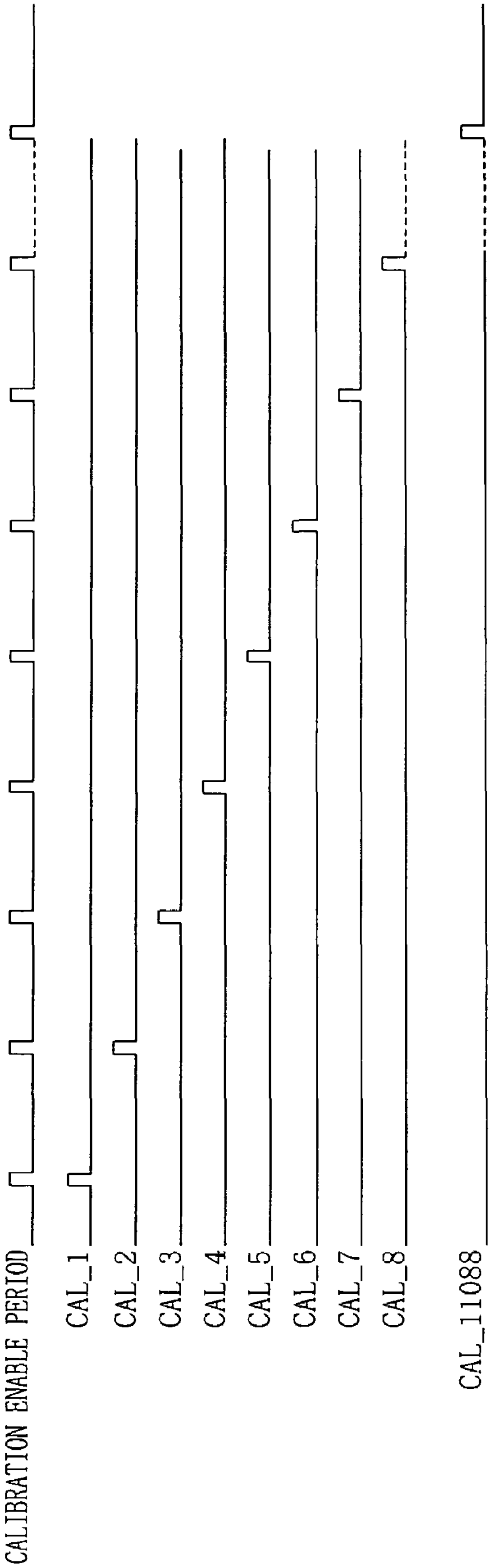
FIG. 9 is a timing chart showing timings of calibration according to a fourth embodiment of the present invention.

First, a case where calibration is performed on one of the 11088 current copy circuits during a blanking period will be described with reference to FIG. 9.

In this case, a timing control circuit 307 sets one of switching signals CAL (CAL_1 through CAL_11088) to be output to the 11088 current copy circuits at "H" during a blanking period. Accordingly, to complete calibration on all the current copy circuits, the time for 11088 (=176×63) lines is required.

<<Calibration 2>>

Figure 10:
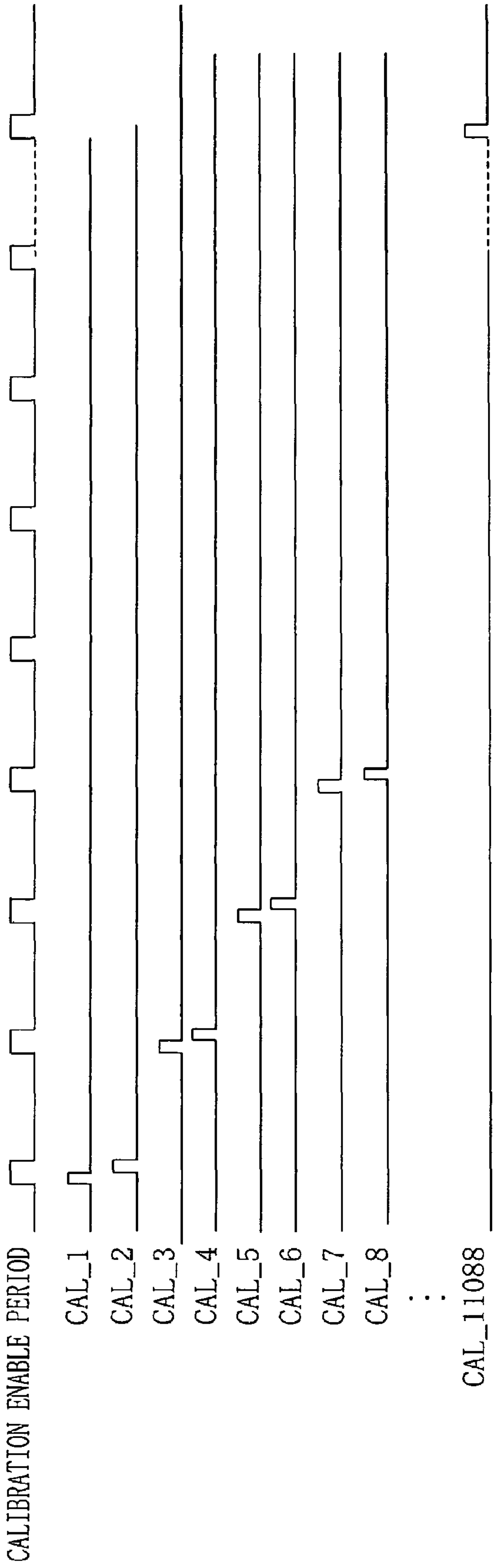
FIG. 10 is a timing chart showing timings of calibration according to the fourth embodiment.

Next, a case where calibration is performed on two of the 11088 current copy circuits during a blanking period will be described with reference to FIG. 10.

In this case, the timing control circuit 307 sets two of switching signals CAL (CAL_1 through CAL_11088) to be output to the 11088 current copy circuits at "H" during a blanking period. Accordingly, to complete calibration on all the current copy circuits, the time for 5544 (=11088/2) lines is required.

<Advantages>

As described above, it is possible to perform calibration on a plurality of current copy circuits during one blanking period. This enables reduction of the time necessary for calibration.

In the display driver of this embodiment, calibration is performed on one or two current copy circuits during a blanking period. Alternatively, calibration may be performed on three or more current copy circuits in a blanking period.

In a case where calibration is performed on a plurality of current copy circuits at a time, a reference current source 302 only needs to be configured to supply a current in an amount necessary for performing calibration on these current copy circuits. For example, if the amount (the current value) of a reference current necessary for performing calibration on one current copy circuit is "I", the reference current source 302 only needs to supply a reference current in an amount of "2I".

EMBODIMENT 5

In the foregoing description, a current as a source of an output current to be output from the signal output terminal 106 is generated by N current copy circuits 1011 through 101N. In this case, a long time is needed to perform calibration on all the current copy circuits, so that the capacitors 003 included in the current copy circuits need to have large capacitances in consideration of this long time. Accordingly, a large amount of reference current is needed to accumulate charge in the capacitors 003 in the current copy circuits in a short time. In addition, if the amount of necessary output current is small (e.g., 1 μA or less), the amount of the reference current decreases accordingly, so that the capacitances of the capacitors 003 in the current copy circuits need to be reduced so as to accumulate charge during a limited blanking period. If the blanking period is increased to extend the calibration time, there arises another problem that the time necessary for transferring display data DATA decreases.

<Overall Configuration>

Figure 11:
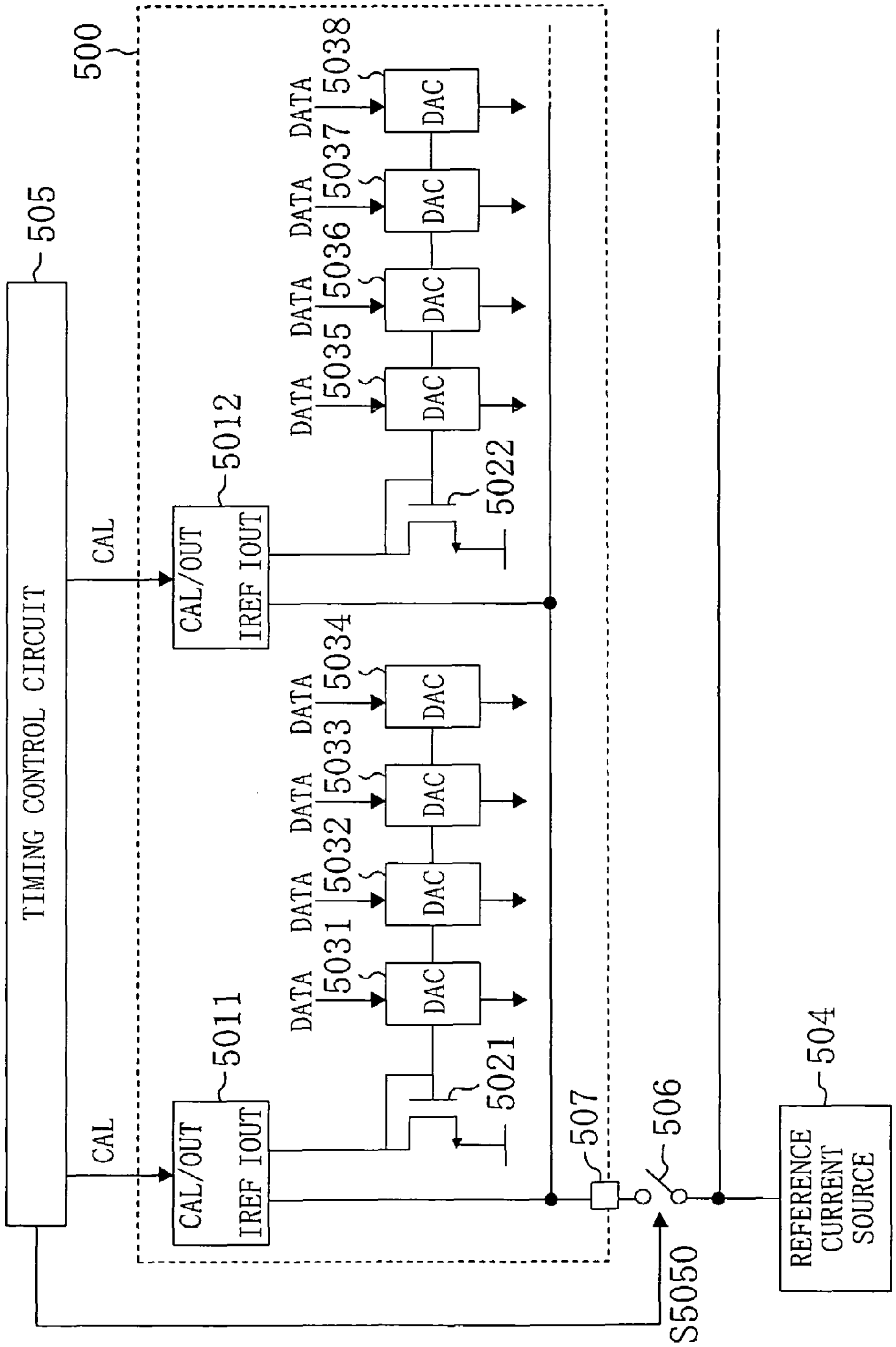
FIG. 11 is a diagram illustrating an overall configuration of a current driver according to a fifth embodiment of the present invention.

FIG. 11 illustrates an overall configuration of a current driver according to a fifth embodiment of the present invention. This current driver is configured by combining current copy circuits and current mirror circuits. The current driver includes: a semiconductor integrated circuit 500; a reference current source 504; a timing control circuit 505; and a switch 506. The semiconductor integrated circuit 500 includes: current copy circuits 5011 and 5012; bias n-transistors 5021 and 5022; current mode D/A converters (DACs) 5031 through 5038; and a connection terminal 507. The reference current source 504 has a configuration similar to that of the reference current source 102 shown in FIG. 2. The current copy circuits 5011 and 5012 have configurations similar to that of the p-type current copy circuit shown in FIG. 3B. The bias n-transistors 5021 and 5022 have MOS diode configurations and receive currents from the current copy circuits 5011 and 5012 at their drains, so that gate voltages according to the received currents are generated at the gates. Each of the current mode D/A converters 5031 through 5034 receives the gate voltage generated at the gate of the bias n-transistor 5021 and generates a current according to display data DATA input from the outside. Each of the current mode D/A converters 5035 through 5038 receives the gate voltage generated at the gate of the bias n-transistor 5022 and generates a current according to display data DATA input from the outside. The connection terminal 507 is an input/output terminal of the semiconductor integrated circuit 500 and is connected to reference current input terminals IREF of the respective current copy circuits 5011 and 5012. The timing control circuit 505 outputs switching signals CAL to the current copy circuits 5011 and 5012 and outputs an open/close signal S5050 to the switch 506. The switch 506 connects the connection terminal 507 and the reference current source 504 to each other in accordance with the open/close signal S5050 from the timing control circuit 505.

<Internal Configuration of Current Mode D/A Converter>

Figure 12:
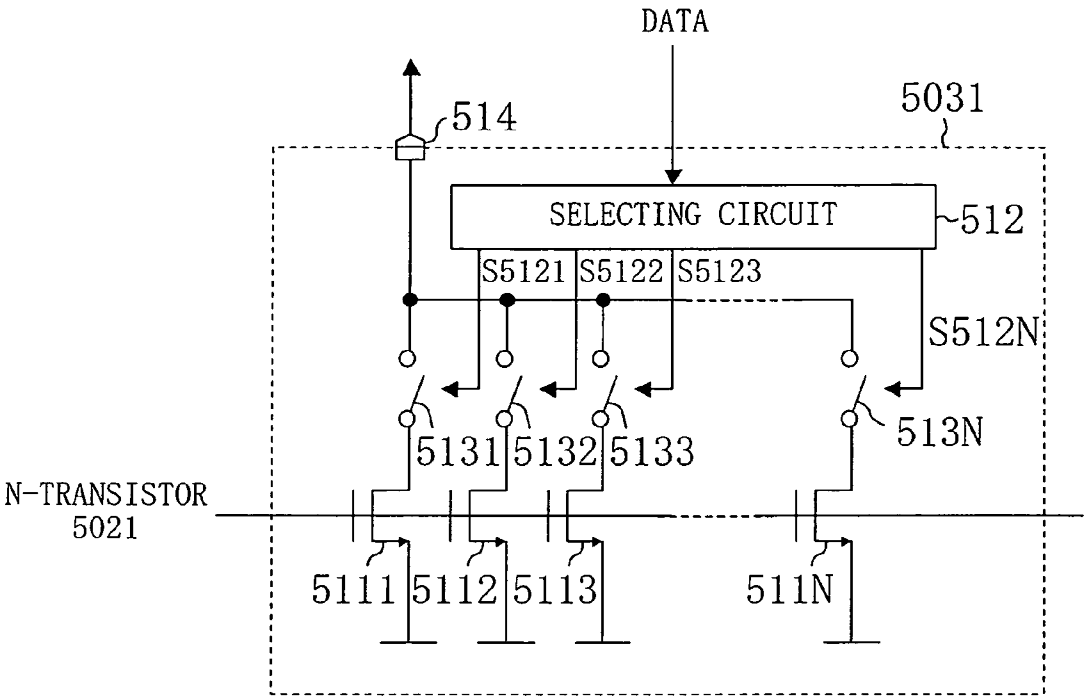
FIG. 12 is a diagram illustrating an internal configuration of one of current mode D/A converter shown in FIG. 11.

Internal configurations of the current mode D/A converters 5031 through 5038 shown in FIG. 11 will be described. The current mode D/A converters 5031 through 5038 have similar internal configurations, and thus the internal configuration of the current mode D/A converter 5031 is shown in FIG. 12 as a representative example. The current mode D/A converter 5031 includes: N output n-transistors 5111 through 511N; a selecting circuit 512; N switches 5131 through 513N; and a signal output terminal 514. The gates of the n-transistors 5111 through 51N are connected to the gate of the bias n-transistor 5021 and each of the n-transistors 5111 through 511N forms a current mirror together with the bias n-transistor 5021. Accordingly, a gate voltage generated at the gate of the bias n-transistor 5021 is applied to the gate of each of the n-transistors 5111 through 511N. The output n-transistors 5111 through 511N have their drains connected to the respective switches 5131 through 513N and their sources connected to ground nodes. The output n-transistors 5111 through 511N output currents according to the gate voltage from their drains. The selecting circuit 512 outputs selecting signals S5121 through S512N to the switches 5131 through 513N in accordance with display data DATA input from the outside. Each of the switches 5131 through 513N connects the drain of the associated one of the output n-transistors to a signal output terminal 514 in accordance with an associated one of the selecting signals S5121 through S512N. The signal output terminal 514 obtains the sum of all the currents input from the output n-transistors 5111 through 511N and causes the resultant current to flow as an output current.

The gates of the output n-transistors 5111 through 511N included in each of the current mode D/A converters 5035 through 5038 are connected to the gate of the bias n-transistor 5022.

<Calibration Mode>

A calibration mode of the current driver shown in FIG. 11 will be described.

First, the timing control circuit 505 sets a switching signal CAL to the current copy circuit 5011 at "H" and sets a switching signal CAL to the other current copy circuit 5012 at "L". When the timing control circuit 505 sets at least one of the switching signals CAL to the current copy circuits 5011 and 5012 at "H", the timing control circuit 505 sets the open/close signal S5050 to the switch 506 at "H".

Next, since the open/close signal S5050 from the timing control circuit 505 is at "H", the switch 506 connects the connection terminal 507 and the reference current source 504 to each other. This causes a current supplied from the reference current source 504 to be input to the reference current input terminals IREF of the current copy circuits 5011 and 5012.

Then, since the switching signal CAL from the timing control circuit 505 is at "H", calibration is performed on the current copy circuit 5011.

Thereafter, the timing control circuit 505 sets the switching signal CAL to the current copy circuit 5011 at "L" and sets the switching signal CAL to the current copy circuit 5012 at "H".

In this manner, calibration is performed on the current copy circuits 5011 and 5012.

<Output Mode>

An output mode of the current driver shown in FIG. 11 will be described.

First, the selecting circuit 512 included in each of the current mode D/A converters 5031 through 5038 receives display data DATA from the outside. Hereinafter, the current mode D/A converter 5031 will be described as a representative example.

Next, the selecting circuit 512 outputs selecting signals S5121 through S512N to the respective switches 5131 through 513N in accordance with the received display data DATA. For example, suppose the display data DATA has 64 levels of gray scale (i.e., if the number of current copy circuits is 63 (N=63).) Then, when the display data DATA is "00H", the selecting circuit 512 sets all the selecting signals S5121 through S512N at "L" so that all the switches 5131 through 513N are turned OFF. On the other hand, when the display data DATA is "3FH", the selecting circuit 512 sets all the selecting signals S5121 through S512N at "H" so that all the switches 5131 through 513N are turned ON. Since all the switches 5131 through 513N are ON when the display data DATA is "3FH", the signal output terminal 514 draws a large amount of current as the sum of currents output from the output n-transistors 5111 through 511N therein.

The foregoing operation is carried out in each of the current mode D/A converters 5031 through 5038.

<Advantages>

As described above, as compared to the first embodiment, the number of current copy circuits on which calibration is performed is greatly reduced (in the case of a QCIF display, the number of current copy circuits is reduced, more specifically, (11088−44) current copy circuits are removed.) Accordingly, the time necessary for calibration is greatly reduced.

The current driver of this embodiment includes only two current copy circuits. Alternatively, three or more current copy circuits may be included. In such a case, one bias n-transistor and four current mode D/A converters are sufficient for one current copy circuit.

In addition, five or more current mode D/A converters may be provided for one current copy circuit.

MODIFIED EXAMPLE OF EMBODIMENT 5

<Overall Configuration>

Figure 13:
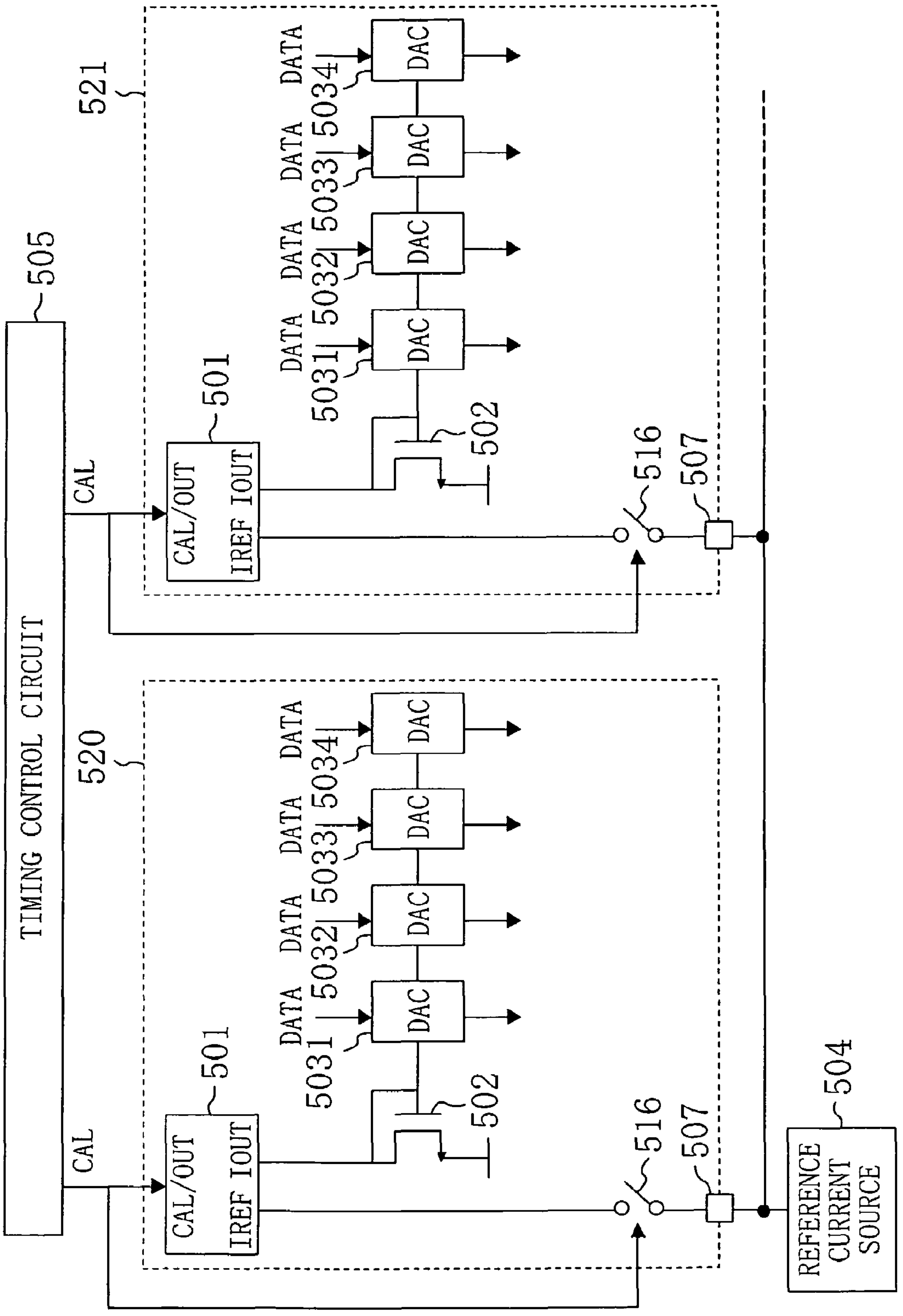
FIG. 13 is a diagram illustrating an overall configuration of a current driver according to a modified example of the fifth embodiment.

FIG. 13 illustrates an overall configuration of a current driver according to a modified example of the fifth embodiment. This current driver includes: semiconductor integrated circuits 520 and 521; a reference current source 504; and a timing control circuit 505. The timing control circuit 505 outputs switching signals CAL to the respective semiconductor integrated circuits 520 and 521.

<Internal Configuration of Semiconductor Integrated Circuit>

The semiconductor integrated circuits 520 and 521 will be described. The semiconductor integrated circuits 520 and 521 have similar configurations, and thus an internal configuration of the semiconductor integrated circuit 520 will be described as a representative example. The semiconductor integrated circuit 520 includes: a current copy circuit 501; a bias n-transistor 502; current mode D/A converters 5031 through 5034; a switch 516; and a connection terminal 507. The current copy circuit 501 has a configuration similar to that of the p-type current copy circuit shown in FIG. 3B. The bias n-transistor 502 has a MOS diode configuration and receives a current from the current copy circuit 501 at its drain, so that a gate voltage according to the received current is generated at the gate thereof. The switch 516 connects a reference current input terminal IREF of the current copy circuit 501 to the connection terminal 507 in accordance with a switching signal CAL from the timing control circuit 505.

<Calibration Mode>

A calibration mode of the current driver shown in FIG. 13 will be described.

First, the timing control circuit 505 sets switching signals CAL to the current copy circuit 501 and the switch 516 included in the semiconductor integrated circuit 520 at "H" and sets switching signals CAL to the current copy circuit 501 and the switch 516 included in the other semiconductor integrated circuit 521 at "L".

Next, since the switching signal CAL from the timing control circuit 505 is at "H", the switch 516 connects the connection terminal 507 and the reference current source 504 to each other in the semiconductor integrated circuit 520. This causes a current supplied from the reference current source 504 to be input to the reference current input terminal IREF of the current copy circuit 501.

Then, since the switching signal CAL from the timing control circuit 505 is at "H", calibration is performed on the current copy circuit 501.

Thereafter, the timing control circuit 505 sets the switching signals CAL to the current copy circuit 501 and the switch 516 included in the semiconductor integrated circuit 520 at "L" and sets the switching signals CAL to the current copy circuit 501 and the switch 516 included in the semiconductor integrated circuit 521 at "H".

In this manner, calibration is performed on the current copy circuits 501 included in the respective semiconductor integrated circuits 520 and 521.

<Advantages>

As described above, as compared to the second embodiment, the number of current copy circuits on which calibration is performed is greatly reduced in a case where the number of outputs is 176. In the case of a QCIF display, the number of current copy circuits is reduced. More specifically, (11088×2)−(44×2) current copy circuits are removed.

The current driver of this embodiment includes only two semiconductor integrated circuits. Alternatively, three or more semiconductor integrated circuits may be included. In such a case, the connection terminals of the semiconductor integrated circuits only need to be connected to a reference current source.

EMBODIMENT 6

In the current drivers of the foregoing embodiments, the number of these current copy circuits is N×M, i.e., is the number obtained by multiplying the number M of signal output terminals by the number N of current copy circuits necessary for one output (where M and N are natural numbers.) In the case of display data DATA having 64 levels of gray scale (i.e., 6 bits), for example, a current driver includes 63 current copy circuits for one signal output terminal.

<Overall Configuration>

Figure 14:
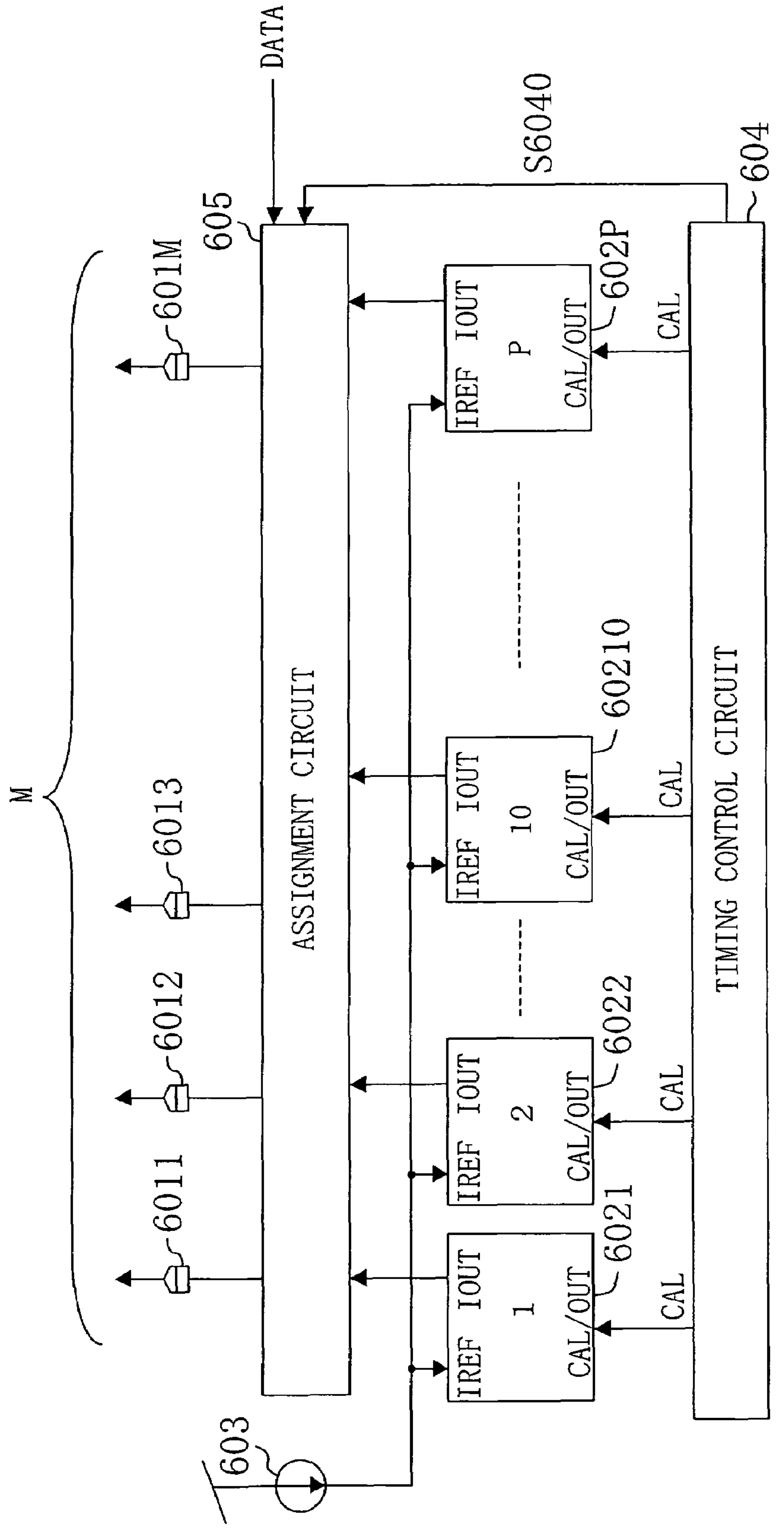
FIG. 14 is a diagram illustrating an overall configuration of a current driver according to a sixth embodiment of the present invention.

FIG. 14 illustrates an overall configuration of a current driver according to a sixth embodiment of the present invention. The current driver includes P current copy circuits 6021 through 602P for M signal output terminals 6011 through 601M (where P is a natural number and P>(the number N of current copy circuits necessary for one output)×(the number M of outputs).) For example, in a case where the number of signal output terminals are three and the number of levels of gray scale of display data DATA corresponds to 6 bits, the current driver includes more than 189 (=63×3) current copy circuits. The current driver further includes: a reference current source 603; a timing control circuit 604; and an assignment circuit 605. The reference current source 603 is similar to the reference current source 102 shown in FIG. 2. The timing control circuit 604 outputs switching signals CAL to the respective P current copy circuits 6021 through 602P and also outputs a calibration signal S6040 to the assignment circuit 605. The calibration signal S6040 indicates a current copy circuit on which calibration is being performed out of the current copy circuits 6021 through 602P. The assignment circuit 605 refers to the calibration signal S6040 from the timing control circuit 604 and display data DATA input thereto and assigns current copy circuits on which calibration is not being performed out of the P current copy circuits 6021 through 602P to the signal output terminals 6011 through 601M. Each of the signal output terminals 6011 through 601M obtains the sum of currents from current copy circuits assigned thereto by the assignment circuit 605 and causes the resultant current to flow as an output current.

<Operation>

Operation of the current driver shown in FIG. 14 will be described.

First, the timing control circuit 604 sets one of the switching signals CAL to the current copy circuits 6021 through 602P at "H" and sets the other switching signals CAL at "L". In the following case, the switching signal CAL to the current copy circuit 6022 is set at "H", so that calibration is performed on the current copy circuit 6022.

The timing control circuit 604 outputs a calibration signal S6040 indicating a current copy circuit on which calibration is being performed to the assignment circuit 605. In this case, a calibration signal S6040 indicating "the current copy circuit 6022" is output.

Next, the assignment circuit 605 refers to the calibration signal S6040 from the timing control circuit 604 and selects the current copy circuits 6021 and 6023 through 602P on which calibration is not being performed out of the P current copy circuits 6021 through 602P. Then, to cause currents according to display data DATA input from the outside to flow from the respective signal output terminals 6011 through 601M, the assignment circuit 605 assigns a non-negative integer number of current copy circuits out of the selected current copy circuits 6021 and 6023 through 602P to the signal output terminals 6011 through 601M. The number of the assigned current copy circuits is determined according to the respective display data items DATA. For example, suppose the levels of gray scale of display data DATA corresponds 6 bits (N=63). Then, if display data items DATA of "00H", "3FH" and "01H" are input to the assignrent circuit 605 in this order, the assignment circuit 605 assigns no current copy circuits to the signal output terminal 6011. In addition, the assignment circuit 605 assigns 63 current copy circuits out of the current copy circuits 6021 and 6023 through 602P on which calibration is not being performed to the signal output terminal 6012. The assignment circuit 605 also assigns one of the current copy circuits 6021 and 6023 through 602P on which calibration is not being performed to the signal output terminal 6013.

Thereafter, each of the signal output terminals 6011 through 601M obtains the sum of currents from a non-negative integer number of current copy circuits assigned thereto by the assignment circuit 605 and causes the resultant current to flow as an output current.

<Advantages>

As described above, provision of one or more redundant current copy circuits enables calibration to be performed on an excess current copy circuit even during a period in which output current is output. Accordingly, even in a case where a blanking period is extremely short or a case where each current copy circuit has a large capacitance to enhance the accuracy, a sufficient time is secured before charging.

EMBODIMENT 7

<Overall Configuration>

Figure 15:
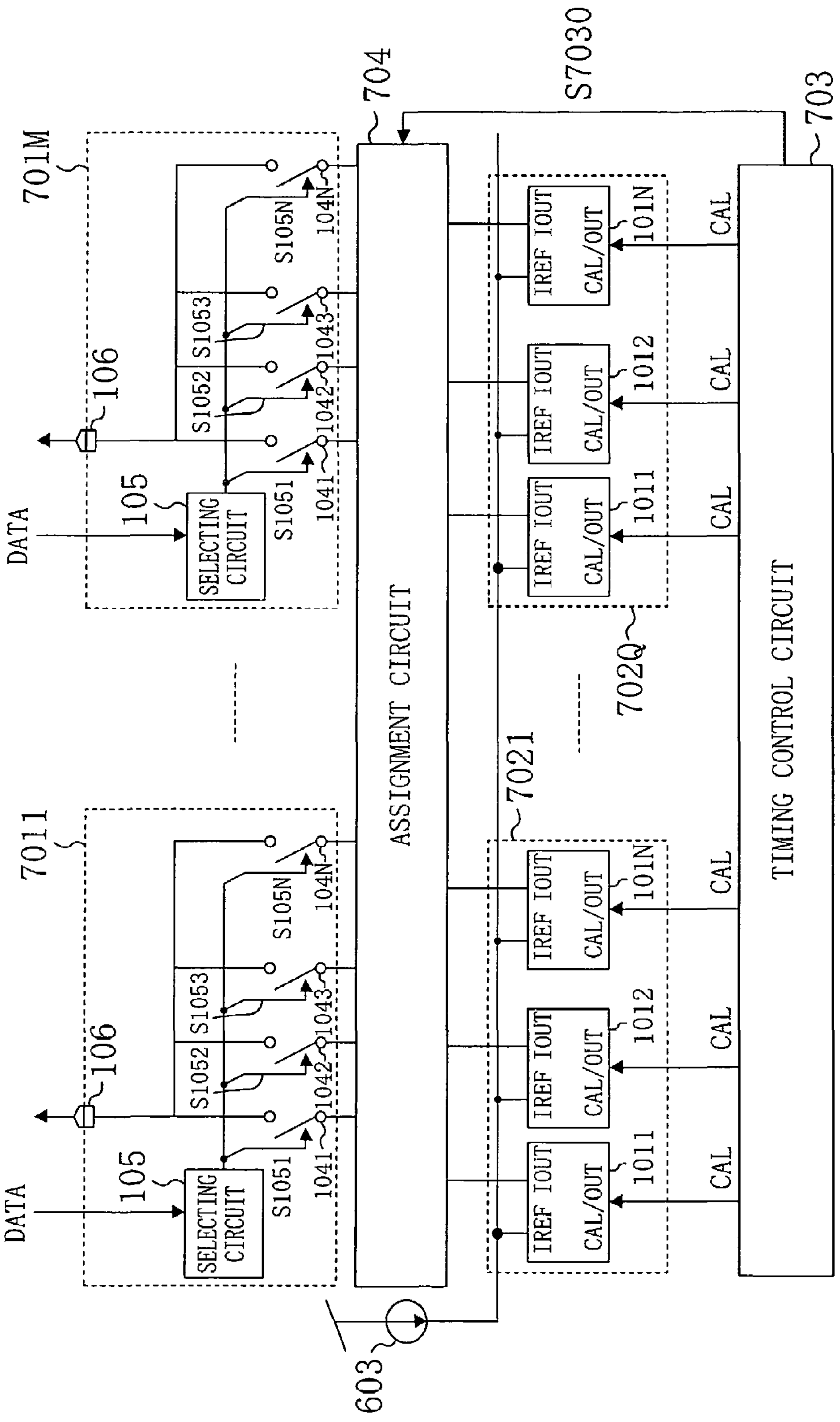
FIG. 15 is a diagram illustrating an overall configuration of a current driver according to a seventh embodiment of the present invention.

FIG. 15 illustrates an overall configuration of a current driver according to a seventh embodiment of the present invention. The current driver includes: a reference current source 603; M selecting sections 7011 through 701M; Q current copy circuit groups 7021 through 702Q (where Q is a natural number and Q>M); a timing control circuit 703; and an assignment circuit 704. Each of the selecting sections 7011 through 701M includes: a selecting circuit 105; switches 1041 through 104N; and a signal output terminal 106. Each of the current copy circuit groups 7021 through 702Q includes N current copy circuits 1011 through 101N necessary for one output. That is, the current driver of this embodiment includes a total of Q×N current copy circuits. The timing control circuit 703 outputs switching signals CAL to the respective Q×N current copy circuits and also outputs a calibration signal S7030 to the assignment circuit 704. The calibration signal S7030 indicates a current copy circuit on which calibration is being performed out of the Q×N current copy circuits. The assignment circuit 704 refers to the calibration signal S7030 from the timing control circuit 703 and assigns current copy circuit groups on which calibration is not being performed out of the current copy circuit groups 7021 through 702Q to the selecting sections 7011 through 701M.

<Operation>

Figure 16:
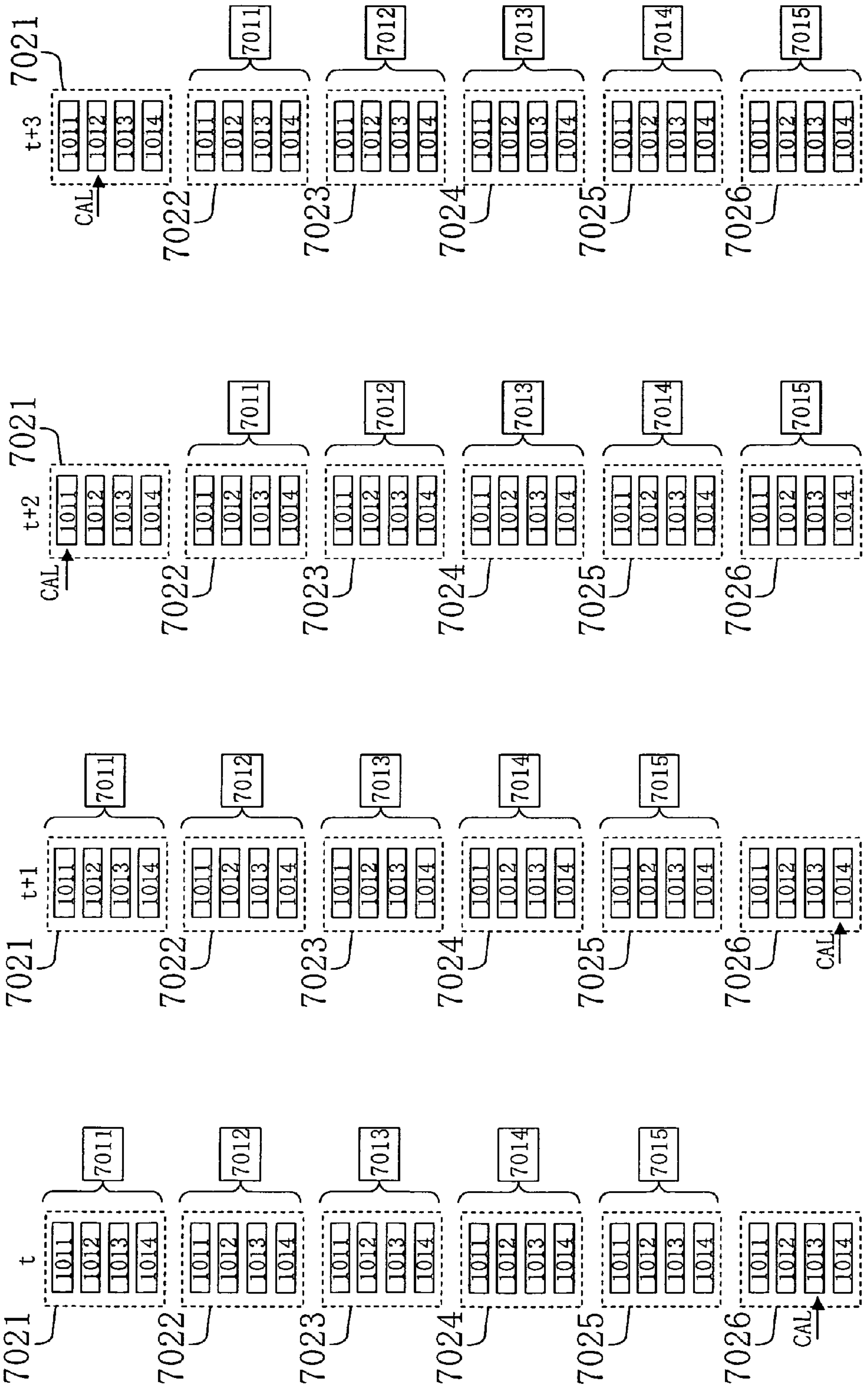
FIG. 16 is a diagram showing operation of the current driver shown in FIG. 15.

Operation of the current driver shown in FIG. 15 will be described with reference to FIG. 16. In this embodiment, the number M of outputs is 5, the number N of current copy circuits necessary for one output is 4, and the number Q of current copy circuit groups is 6. That is, the current driver includes six current copy circuit groups 7021 through 7026 and five selecting sections 7011 through 7015. Each selecting section includes four switches 1041 through 1044. Each current copy circuit group includes four current copy circuits 1011 through 1014. Accordingly, the current driver includes four redundant current copy circuits.

At time t, calibration is being performed on the current copy circuit 1013 included in the current copy circuit group 7026, so that the timing control circuit 703 outputs a calibration signal S7030 indicating "the current copy circuit 1013 included in the current copy circuit group 7026" to the assignment circuit 704. Then, the assignment circuit 704 refers to the calibration signal S7030 from the timing control circuit 703 and selects the current copy circuit groups 7021 through 7025 except the current copy circuit group 7026. Subsequently, the assignment circuit 704 assigns the current copy circuit groups 7021 through 7025 to the selecting sections 7011 through 7015. At this time, the switches 1041 through 1044 included in each of the selecting sections 7011 through 7015 are connected to the respective current copy circuits 1011 through 1014 in a one-to-one relationship.

At time t+1, calibration is being performed on the current copy circuit 1014 included in the current copy circuit group 7026. As at time t, the assignment circuit 704 assigns the current copy circuit groups 7021 through 7025 to the selecting sections 7011 through 7015.

At time t+2, calibration is being performed on the current copy circuit 1011 included in the current copy circuit group 7021, so that the timing control circuit 703 outputs a calibration signal S7030 indicating "the current copy circuit 1011 included in the current copy circuit group 7021" to the assignment circuit 704. Thereafter, the assignment circuit 704 refers to the calibration signal S7030 from the timing control circuit 703 and selects the current copy circuit groups 7022 through 7026 except the current copy circuit group 7021. Then, the assignment circuit 704 assigns the current copy circuit groups 7022 through 7026 to the selecting sections 7011 through 7015.

At time t+3, calibration is being performed on the current copy circuit 1012 included in the current copy circuit group 7021, the timing control circuit 703 outputs a calibration signal S7030 indicating "the current copy circuit 1021 included in the current copy circuit group 7021" to the assignment circuit 704. As at time t+2, the assignment circuit 704 assigns the current copy circuit groups 7022 through 7026 to the selecting sections 7011 through 7015.

<Advantages>

As described above, provision of redundant current copy circuits enables calibration to be performed on a current copy circuit, irrespective of whether a blanking period is present or not. In addition, since a current copy circuit in an output mode is always assigned to each of the M selecting sections 7011 through 701M, output currents are generated with stability. Moreover, the accuracy in calibration is designed as intended depending on the size of a parasitic capacitance and leakage current.

MODIFIED EXAMPLE OF EMBODIMENT 7

<Overall Configuration>

Figure 17:
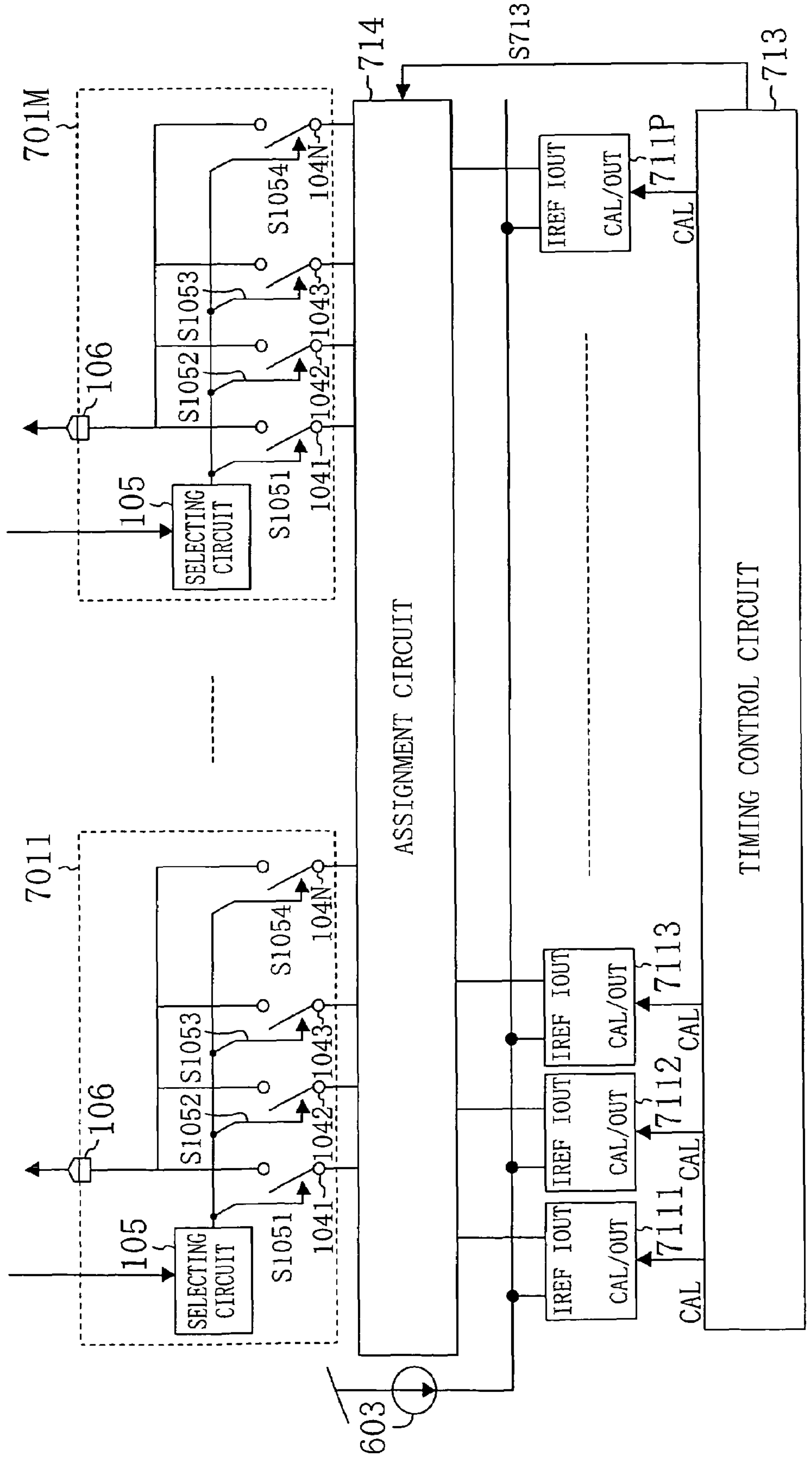
FIG. 17 is a diagram illustrating an overall configuration of a current driver according to a modified example of the seventh embodiment.

FIG. 17 illustrates an overall configuration of a current driver according to a modified example of the seventh embodiment. The current driver includes a timing control circuit 713, an assignment circuit 714 and P current copy circuits 7111 through 711P (where P>N×M), instead of the timing control circuit 703, the assignment circuit 704 and the Q current copy circuit groups 7021 through 702Q shown in FIG. 15. The other part of the configuration is similar to that shown in FIG. 15. The timing control circuit 713 outputs switching signals CAL to the respective current copy circuits 7111 through 711P and also outputs a calibration signal S713 to the assignment circuit 714. The calibration signal S713 indicates a current copy circuit on which calibration is being performed out of the P current copy circuits 7111 through 711P. The assignment circuit 714 refers to the calibration signal S713 from the timing control circuit 713 and assigns current copy circuits on which calibration is not being performed out of the current copy circuits 7111 through 711P to the switches 1041 through 104N included in each of the selecting sections 7011 through 701M.

<Operation>

Figure 18:
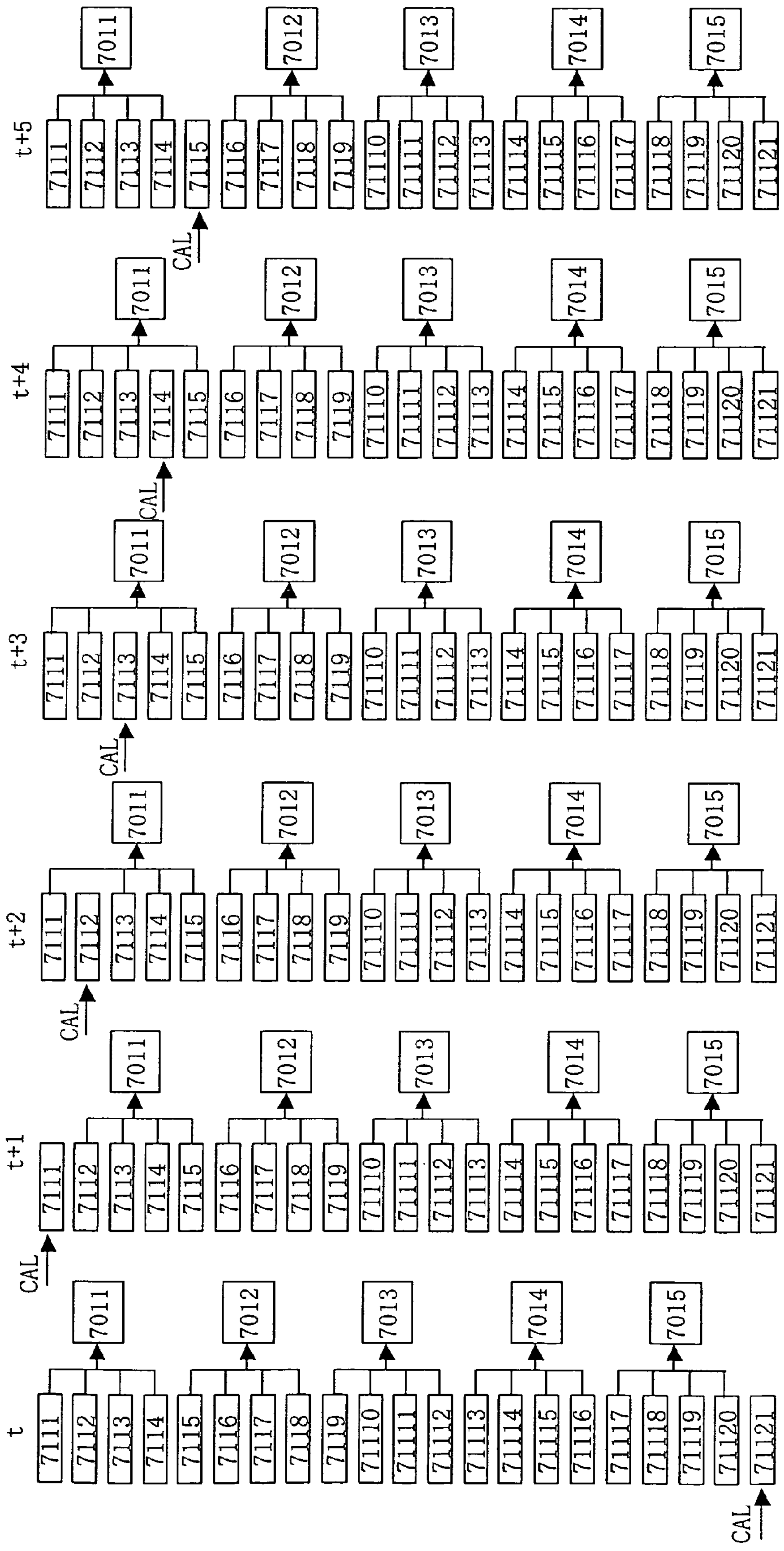
FIG. 18 is a diagram showing operation of the current driver shown in FIG. 17.

Operation of the current driver shown in FIG. 17 will be described with reference to FIG. 18. In this modified example, the number M of outputs is 5, the number N of current copy circuits necessary for one output is 4, and the total number P of current copy circuits is 21. That is, the current driver includes 21 current copy circuits 7111 through 71121 and five selecting sections 7011 through 7015. Each selecting section includes four switches 1041 through 1044. Accordingly, the current driver includes one redundant current copy circuit.

At time t, calibration is being performed on the current copy circuit 71121, so that the timing control circuit 713 outputs a calibration signal S713 indicating "the current copy circuit 71121" to the assignment circuit 714. Then, the assignment circuit 714 refers to the calibration signal S713 from the timing control circuit 713 and selects the current copy circuits 7111 through 71120 except the current copy circuit 71121. Subsequently, the assignment circuit 714 assigns the current copy circuits 7111 through 7114 to the selecting section 7011, assigns the current copy circuits 7115 through 7118 to the selecting section 7012, assigns the current copy circuits 7119 through 71112 to the selecting section 7013, assigns the current copy circuits 71113 through 71116 to the selecting section 7014, and assigns the current copy circuits 71117 through 71120 to the selecting section 7015.

At time t+1, calibration is being performed on the current copy circuit 7111, so that the timing control circuit 713 outputs a calibration signal S713 indicating "the current copy circuit 7111" to the assignment circuit 714. Then, the assignment circuit 714 refers to the calibration signal S713 from the timing control circuit 713 and selects the current copy circuits 7112 through 71121 except the current copy circuit 7111. Subsequently, the assignment circuit 714 assigns the current copy circuits 7112 through 7115 to the selecting section 7011, assigns the current copy circuits 7116 through 7119 to the selecting section 7012, assigns the current copy circuits 71110 through 71113 to the selecting section 7013, assigns the current copy circuits 71114 through 71117 to the selecting section 7014, and assigns the current copy circuits 71118 through 71121 to the selecting section 7015.

At time t+2, calibration is being performed on the current copy circuit 7112, so that the timing control circuit 713 outputs a calibration signal S713 indicating "the current copy circuit 7112" to the assignment circuit 714. Thereafter, the assignment circuit 714 refers to the calibration signal S713 from the timing control circuit 713 and selects the current copy circuits 7111 and 7113 through 71121 except the current copy circuit 7112. Then, the assignment circuit 714 assigns the current copy circuits 7111 and 7113 through 7115 to the selecting section 7011, assigns the current copy circuits 7116 through 7119 to the selecting section 7012, assigns the current copy circuits 71110 through 71113 to the selecting section 7013, assigns the current copy circuits 71114 through 71117 to the selecting section 7014, and assigns the current copy circuits 71118 through 71121 to the selecting section 7015.

Thereafter, similar processes are carried out at times t+3, t+4 and t+5.

In this manner, the assignment circuit 714 refers to the calibration signal S713 from the timing control circuit 713 and assigns current copy circuits on which calibration is not being performed out of the current copy circuits 7111 through 71121 to the selecting sections 7011 through 7015.

<Advantages>

As described above, provision of a redundant current copy circuit enables calibration to be performed on a current copy circuit, irrespective of whether a blanking period is present or not. In addition, since a current copy circuit in an output mode is always assigned to each of the M selecting sections 7011 through 701M, output currents are output with stability.

Moreover, the accuracy in calibration is designed as intended depending on the size of a parasitic capacitance and leakage current.

EMBODIMENT 8

<Overall Configuration>

A display driver according to an eighth embodiment of the present invention includes data drivers 8011, 8012 and 8013 and a timing control circuit 802, instead of the data drivers 3061, 3062 and 3063 and the timing control circuit 307 shown in FIG. 5. The other part of the configuration is similar to that shown in FIG. 5. The timing control circuit 802 outputs switching signals CAL to current copy circuits included in each of the data drivers 8011, 8012 and 8013 and also outputs a calibration signal S802. The calibration signal S802 indicates a current copy circuit on which calibration is being performed.

<Internal Configuration of Data Driver>

Figure 19:
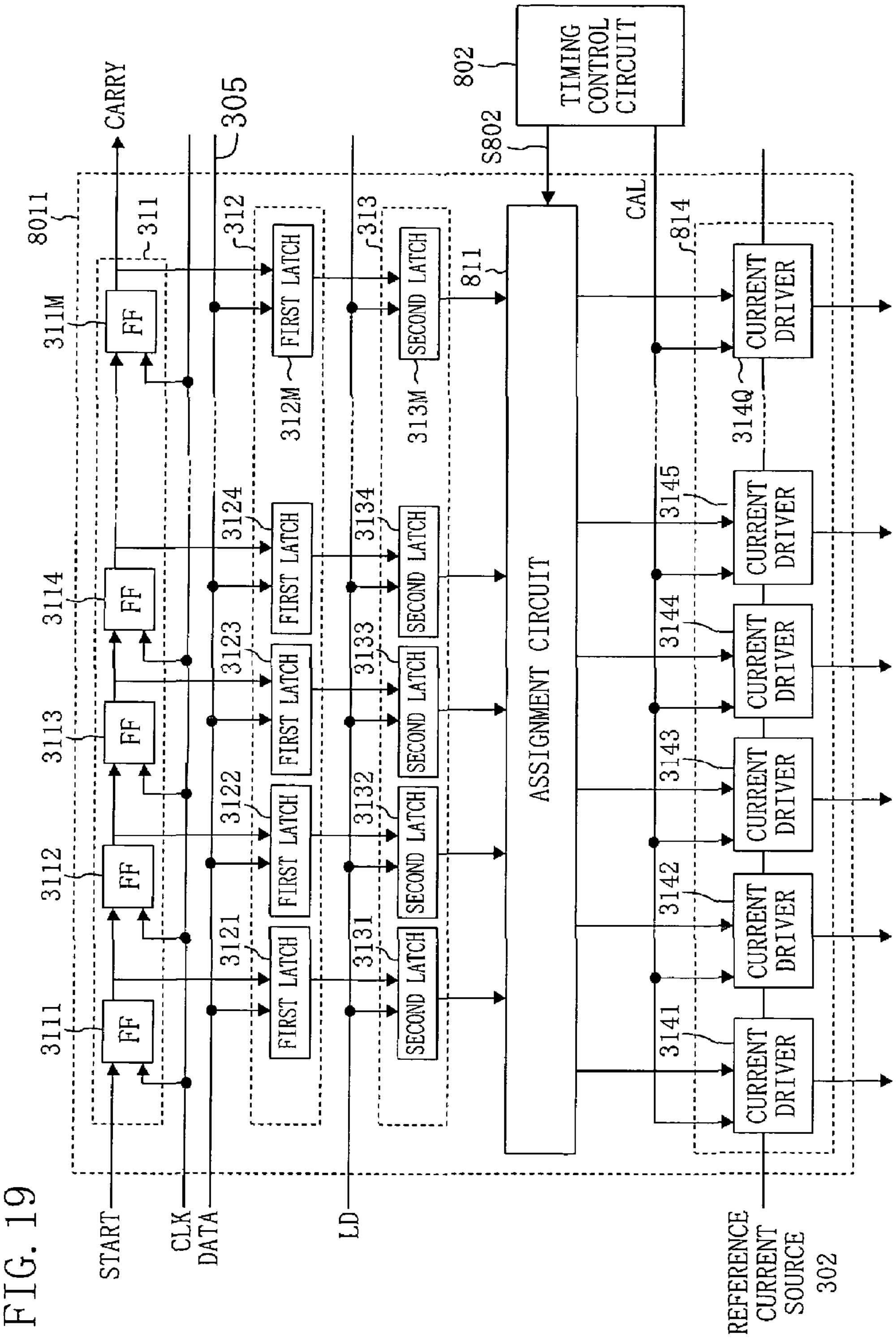
FIG. 19 is a diagram illustrating an internal configuration of a data driver according to an eighth embodiment of the present invention.

Internal configurations of the data drivers 8011, 8012 and 8013 will be described. The data drivers 8011, 8012 and 8013 have similar configurations, and thus the internal configuration of the data driver 8011 is shown in FIG. 19 as a representative example. The data driver 8011 includes a current driver group 814 and an assignment circuit 811, instead of the current driver group 314 shown in FIG. 6. The current driver group 814 includes Q current drivers 3141 through 314Q (where Q>M.) The timing control circuit 802 outputs switching signals CAL to the N current copy circuits 1011 through 101N included in each of the current drivers 3141 through 314Q and outputs a calibration signal S802 to the assignment circuit 811. The calibration signal S802 indicates a current copy circuit on which calibration is being performed out of the N current copy circuits 1011 through 101N included in each of the Q current drivers 3141 through 314Q. The assignment circuit 811 refers to the calibration signal S802 from the timing control circuit 802 and assigns the current drivers 3141 through 314Q to second latch circuits 3131 through 313M.

<Operation>

Figure 20:
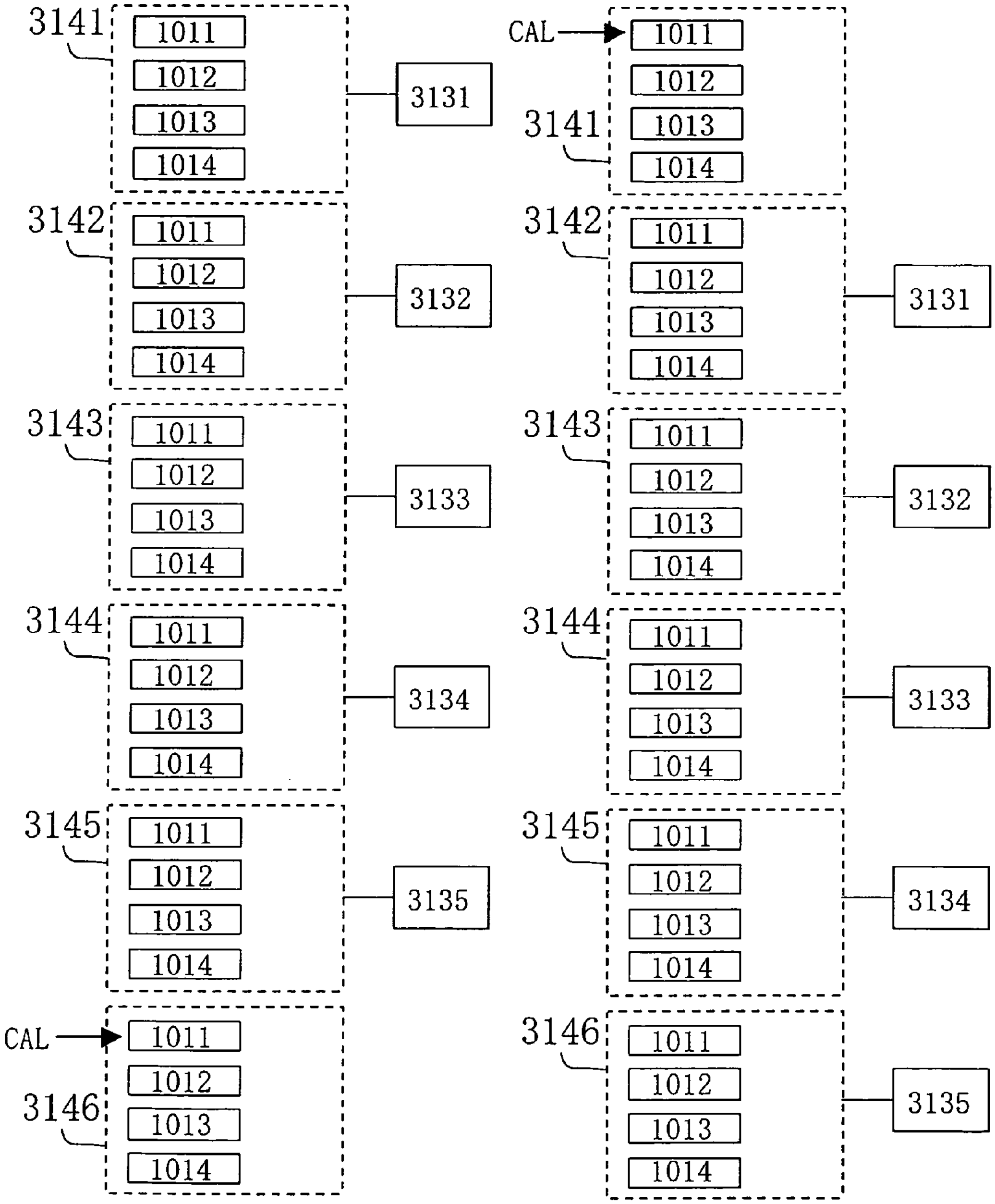
FIG. 20 is a diagram showing operation of the data driver shown in FIG. 19.

Operation of the data driver 8011 shown in FIG. 19 will be described with reference to FIG. 20. In this embodiment, the number M of outputs is 5, the number N of current copy circuits necessary for one output is 4, and the number Q of current drivers is 6. That is, the data driver includes five second latch circuits 3131 through 3135 and six current drivers 3141 through 3146. Each current driver includes four current copy circuits 1011 through 1014. Accordingly, one redundant current driver is provided.

First, the timing control circuit 802 sets the switching signal CAL to the current copy circuit 1011 included in the current driver 3146 at "H". At this time, the timing control circuit 802 outputs a calibration signal S802 indicating "the current copy circuit 1011 included in the current driver 3146" to the assignment circuit 811.

Then, the assignment circuit 811 refers to the calibration signal S802 from the timing control circuit 802 and selects the current drivers 3141 through 3145 except the current driver 3146. Subsequently, the assignment circuit 811 assigns the current drivers 3141 through 3145 to the second latch circuits 3131 through 3135.

In a case where the switching signal CAL to the current copy circuit 1011 included in the current driver 3141 is set at "H", the timing control circuit 802 outputs a calibration signal S802 indicating "the current copy circuit 1011 included in the current driver 3141" to the assignment circuit 811. The assignment circuit 811 performs operation as described above and assigns the current drivers 3142 through 3146 to the second latches 3131 through 3135.

<Advantages>

Provision of a redundant current driver as described above enables calibration to be performed on a current circuit even while an output current is being output. In addition, the current drivers are always appropriately assigned to the second latch circuits, so that stable operation is achieved.

In this embodiment, (Q−M) redundant current drivers are provided in this embodiment. The same advantages are obtained even when (Q−M) redundant second latch circuits are additionally provided. In such a case, it is sufficient that Q second latch circuits and Q current drivers are made in a one-to-one relationship and an assignment circuit for assigning one of the Q latch circuits to each of M first latch circuits in accordance with the calibration signal S802 from the timing control circuit 802 is used.

EMBODIMENT 9

<Overall Configuration>

A display driver according to a ninth embodiment of the present invention includes data drivers 9001, 9002 and 9003 and a timing control circuit 901, instead of the data drivers 3061, 3062 and 3063 and the timing control circuit 307 shown in FIG. 5. The other part of the configuration is similar to that shown in FIG. 5. The timing control circuit 901 outputs switching signals CAL to current copy circuits included in each of the data drivers 9001, 9002 and 9003 and also outputs a calibration signal S901. The calibration signal S901 indicates a current copy circuit on which calibration is being performed.

<Internal Configuration of Data Driver>

Figure 21:
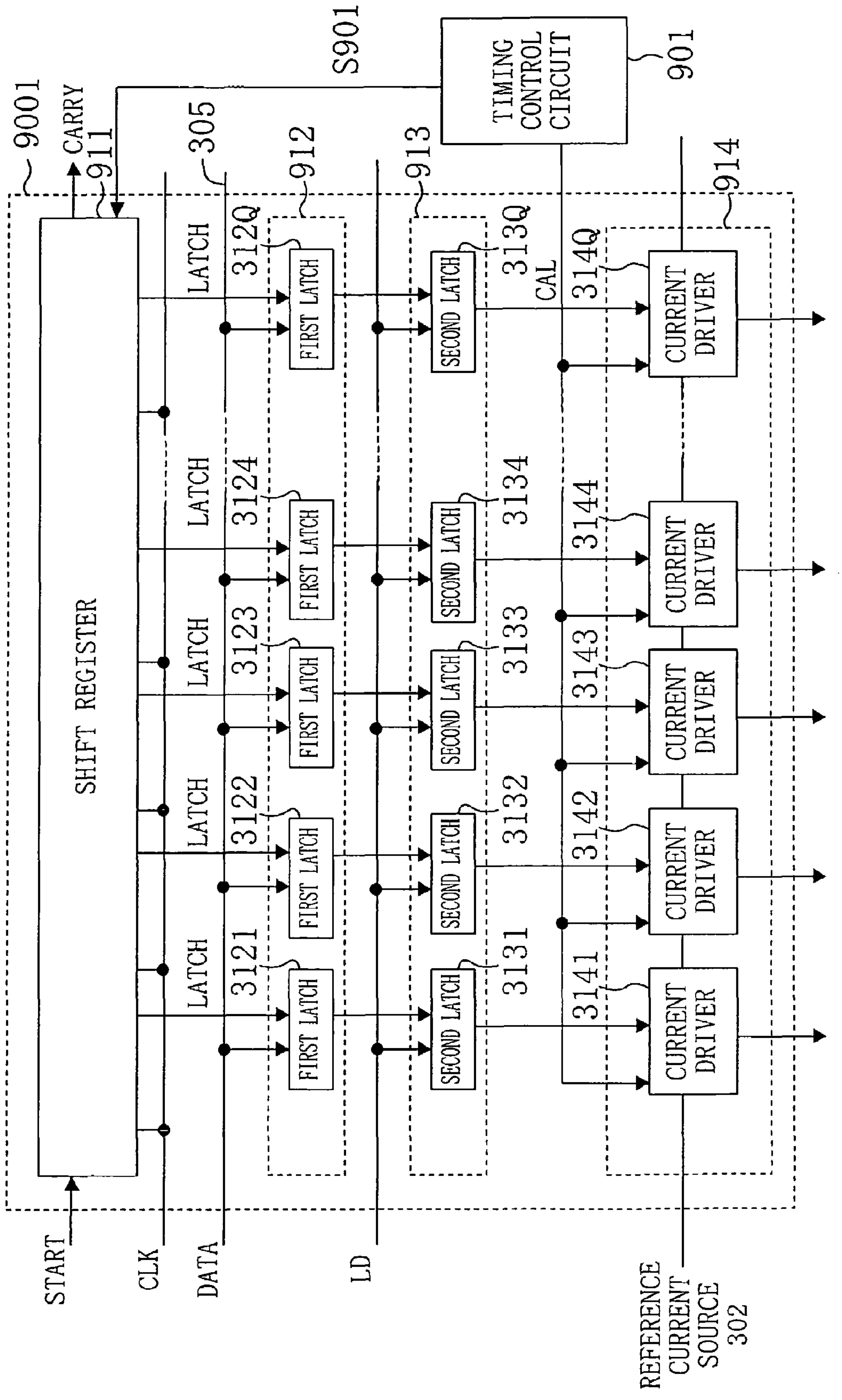
FIG. 21 is a diagram illustrating an internal configuration of a data driver according to a ninth embodiment of the present invention.

Internal configurations of the data drivers 9001, 9002 and 9003 will be described. The data drivers 9001, 9002 and 9003 have similar configurations, and thus the internal configuration of the data driver 9001 is shown in FIG. 21 as a representative example. The data driver 9001 includes: a shift register 911; a first latch group 912; a second latch group 913; and a current driver group 914. In accordance with the calibration signal S901 from the timing control circuit 901, the shift register 911 sequentially shifts a start timing signal START from a controller 303 in synchronization with a given clock CLK, thereby outputting latch timing signals LATCH to the first latch group 912. When the start timing signal START from the controller 303 reaches the end of the shift register 911, the shift register 911 outputs this start timing signal START to the data driver at the next stage as a carry signal CARRY. The first latch group 912 includes Q first latch circuits 3121 through 312Q. The second latch group 913 includes Q second latch circuits 3131 through 313Q. The current driver group 914 includes Q current drivers 3141 through 314Q. The first latch circuits 3121 through 312Q have configurations similar to that of the first latch circuit 3121 and are associated with the respective second latch circuits 3131 through 313Q in a one-to-one relationship. The second latch circuits 3131 through 313Q have configuration similar to that of the second latch circuit 3131 and connected to the respective current drivers 3141 through 314Q in a one-to-one relationship. The timing control circuit 901 outputs switching signals CAL to the respective current copy circuits 1011 through 101N included in each of the current drivers 3141 through 314Q and also outputs a calibration signal S901 to the shift register 911.

The data drivers 9002 and 9003 receive carry signals CARRY, instead of the start signal START.

<Internal Configuration of Shift Register>

Figure 22:
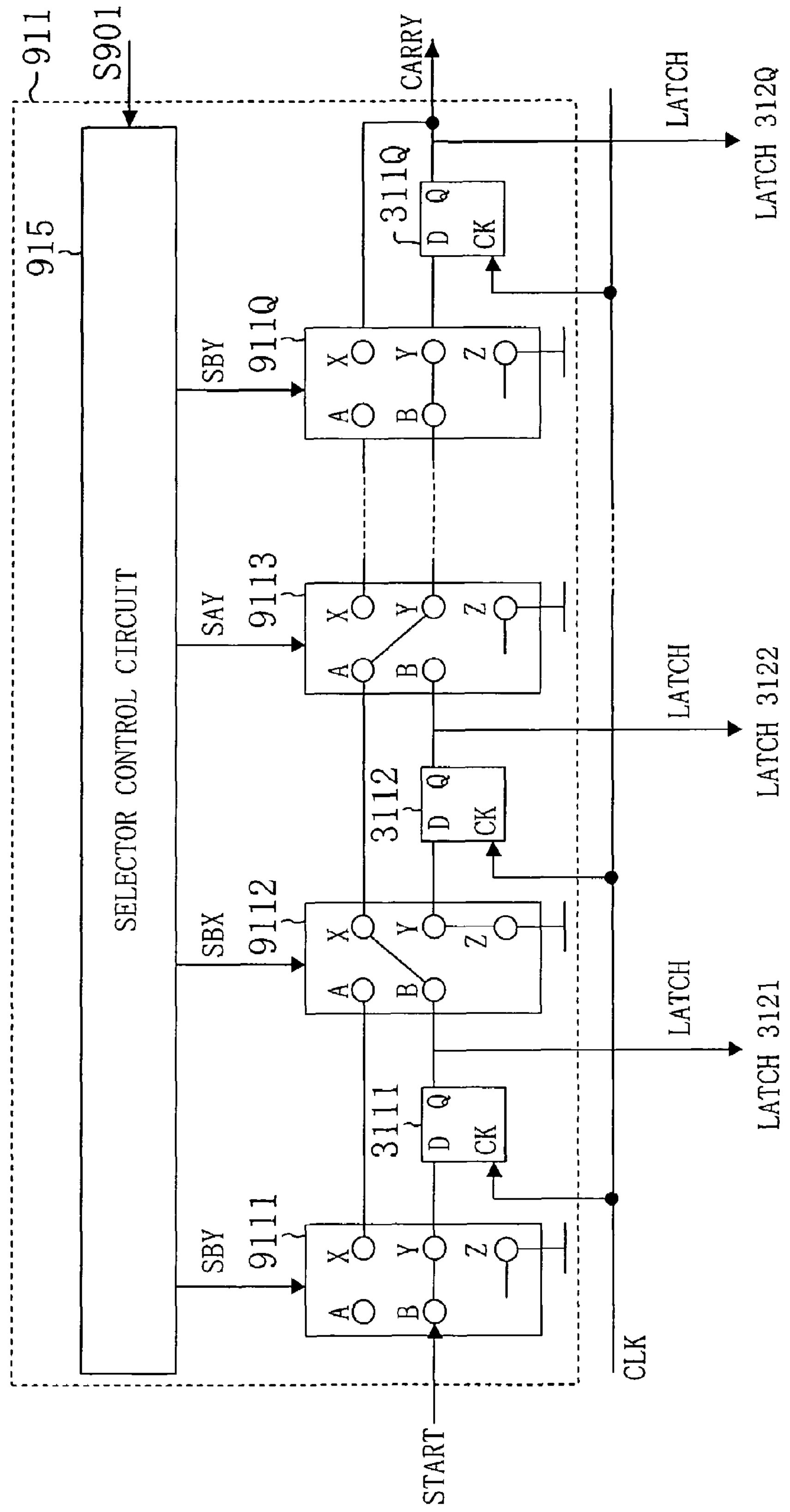
FIG. 22 is a diagram illustrating an internal configuration of the shift register shown in FIG. 21.

FIG. 22 shows an internal configuration of the shift register 911 shown in FIG. 21. The shift register 911 includes: Q flip-flops 3111 through 311Q; a selector control circuit 915; and Q selectors 9111 through 911Q. The Q flip-flops 3111 through 311Q have configurations similar to that of the flip-flop 3111 and are connected to the respective first latch circuits 3121 through 312Q in a one-to-one relationship. The selector control circuit 915 controls the selectors 9111 through 911Q in accordance with a calibration signal S901. The calibration signal S901 indicates a current copy circuit on which calibration is being performed out of the N current copy circuits 1011 through 101N included in each of the Q current drivers 3141 through 314Q.

<Selector Control Circuit>

The selector control circuit 915 shown in FIG. 22 will be described. The selector control circuit 915 identifies a current driver including a current copy circuit indicated by the calibration signal S901 from the timing control circuit 901 and selects a flip-flop associated with the identified current driver in a one-to-one relationship. Then, the selector control circuit 915 outputs a select signal SAY to a selector at the next stage of the selected flip-flop, outputs a select signal SBX to a selector at the immediately preceding stage of the selected flip-flop, and outputs select signals SBY to the other selectors.

<Selector>

The selectors 9111 through 911Q shown in FIG. 22 will be described. Each of the selectors 9111 through 911Q includes terminals A, B, X, Y and Z. The terminal A is connected to the terminal X included in the selector at the immediately preceding stage. The terminal B is connected to an output terminal of the flip-flop at the immediately preceding stage. The terminal Y is connected to a signal input terminal of the flip-flop at the next stage. The terminal Z is connected to a ground node. Each of the selectors 9111 through 911Q connects the terminals A and Y together upon reception of a select signal SAY, connects the terminals B and X together and the terminals Y and Z together upon reception of a select signal SBX, and connects the terminals B and Y together upon reception of a select signal SBY.

<Operation>

Operation of the data driver 9001 shown in FIG. 21 will be described with reference to FIGS. 23A and 23B. In this embodiment, the number M of outputs is 5, the number N of current copy circuits necessary for one output is 4, the number Q of flip-flops is 6 and the number Q of selectors is 6. That is, the data driver 9001 includes six selectors 9111 through 9116, six flip-flops 3111 through 3116, six first latch circuits 3121 through 3126, six second latch circuits 3131 through 3136 and six current drivers 3141 through 3146. Each current driver includes four current copy circuits 1011 through 1014. Accordingly, one set of redundant flip-flop, first latch circuit, second latch circuit and current driver is provided.

Figure 23B:
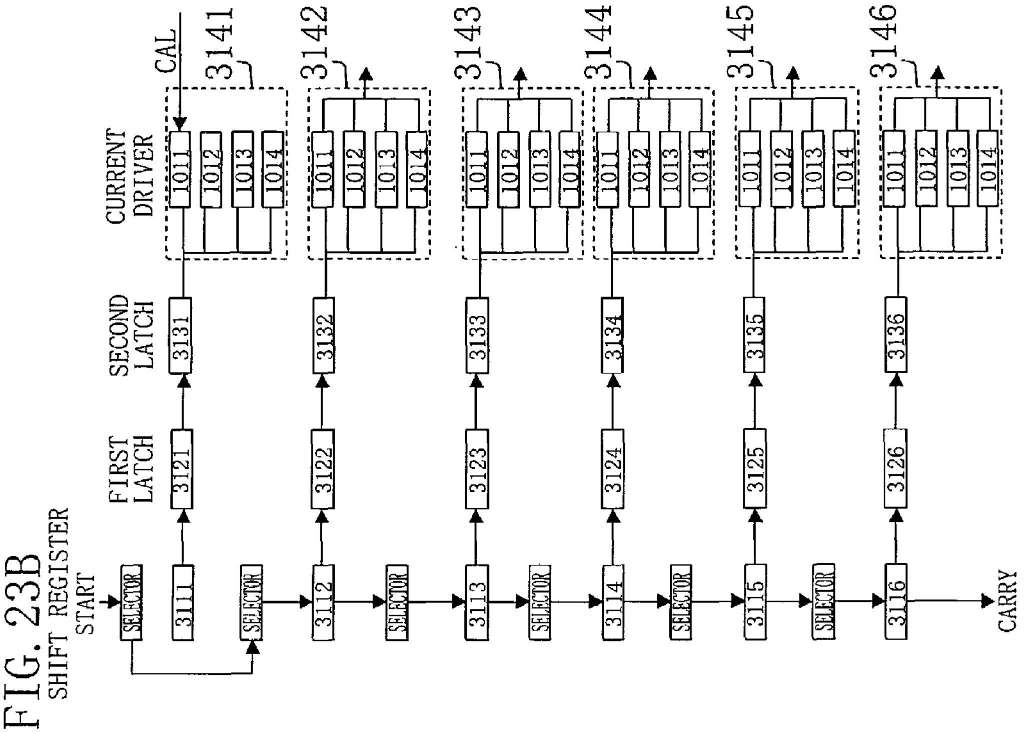
FIGS. 23A and 23B are diagrams showing operation of the data driver shown in FIG. 21.
Figure 23A:
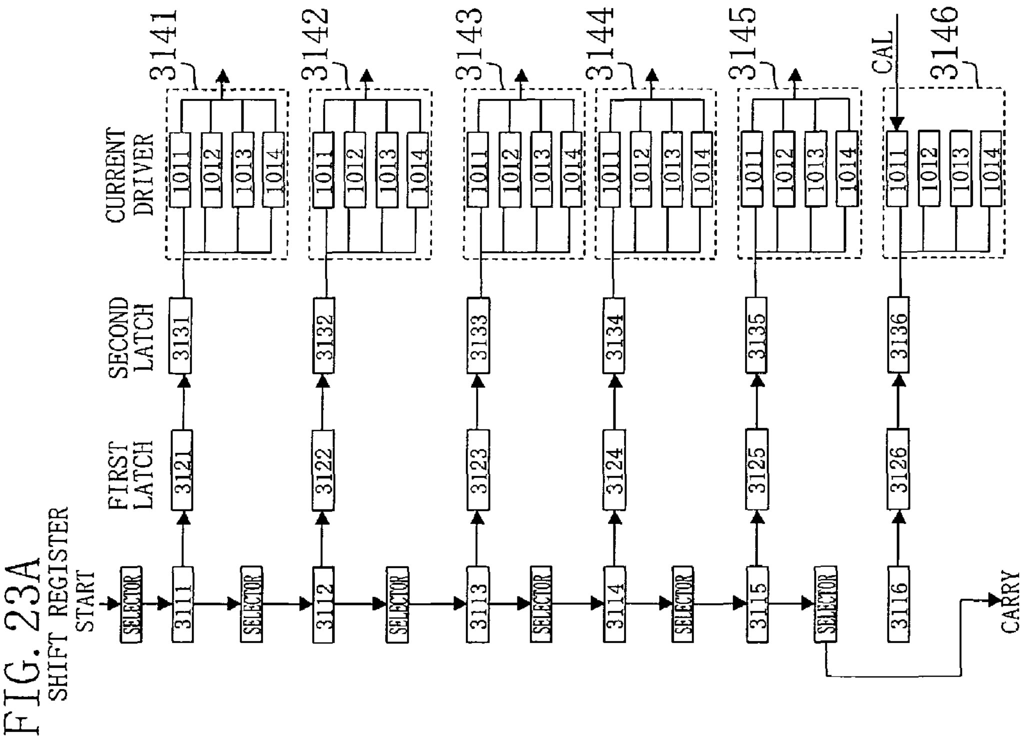

First, as shown in FIG. 23A, the timing control circuit 901 sets the switching signal CAL to the current copy circuit 1011 included in the current driver 3146 at "H" and sets the switching signals CAL to the other current copy circuits at "L". At this time, the timing control circuit 901 outputs a calibration signal S901 indicating "the current copy circuit 1011 included in the current driver 3146" to the selector control circuit 915.

Then, the selector control circuit 915 refers to the calibration signal S901 from the timing control circuit 901, selects the current driver 3146 including a current copy circuit on which calibration is being performed out of the current drivers 3141 through 3146, and selects the flip-flop 3116 associated with the selected current driver 3146.

Thereafter, the selector control circuit 915 outputs a select signal SBX to the selector 9116 at the stage immediately preceding the selected flip-flop 3116 and outputs select signals SBY to the other selectors 9111 through 9115.

Subsequently, the selector 9116 connects the terminals B and X together in accordance with the select signal SBX from the selector control circuit 915. Each of the other selectors 9111 through 9115 connects the terminals B and Y together in accordance with the select signal SBY from the selector control circuit 915.

With these connections, a start timing signal START from the flip-flop 3115 is transmitted to the outside as a carry signal without passing through the flip-flop 3116.

While calibration is being performed on the current copy circuit 1011 included in the current driver 3141 as shown in FIG. 23B, the selector control circuit 915 refers to the calibration signal S901 and outputs a select signal SBX to the selector 9111, a select signal SAY to the selector 9112, and select signals SBY to the other selectors 9113 through 9116, as in the operation described above. Accordingly, a start timing signal START from the controller 303 is transmitted to the flip-flop 3112 without passing through the flip-flop 3111.

<Advantages>

As described above, a flip-flop skipped by a selector outputs no latch timing signal, so that a first latch circuit associated with this flip-flop takes no display data DATA therein. In this manner, a redundant set of flip-flop, first latch group, second latch group and current driver is provided, so that an output current is generated without using a current copy circuit on which calibration is being performed.

Selectors may be basic logic or may be configured by using wired OR circuits with open drain.

In this embodiment, only one flip-flop is skipped, but two or more continuous flip-flops may be skipped. For example, in a case where two flip-flops are skipped, the selector control circuit 915 outputs a select signal SBX to a selector at the immediately preceding stage of the first (foremost) flip-flop out of the flip-flops to be skipped, outputs a select signal SAY to a selector at the next stage of the other flip-flop out of the flip-flops to be skipped, and outputs a select signal SAX to a selector connected between the flip-flops to be skipped. Upon reception of the select signal SAX, each of the selectors 9111 through 911Q connects the terminals A and X to each other. In this manner, a plurality of continuous selectors are skipped.

EMBODIMENT 10

Figure 24:
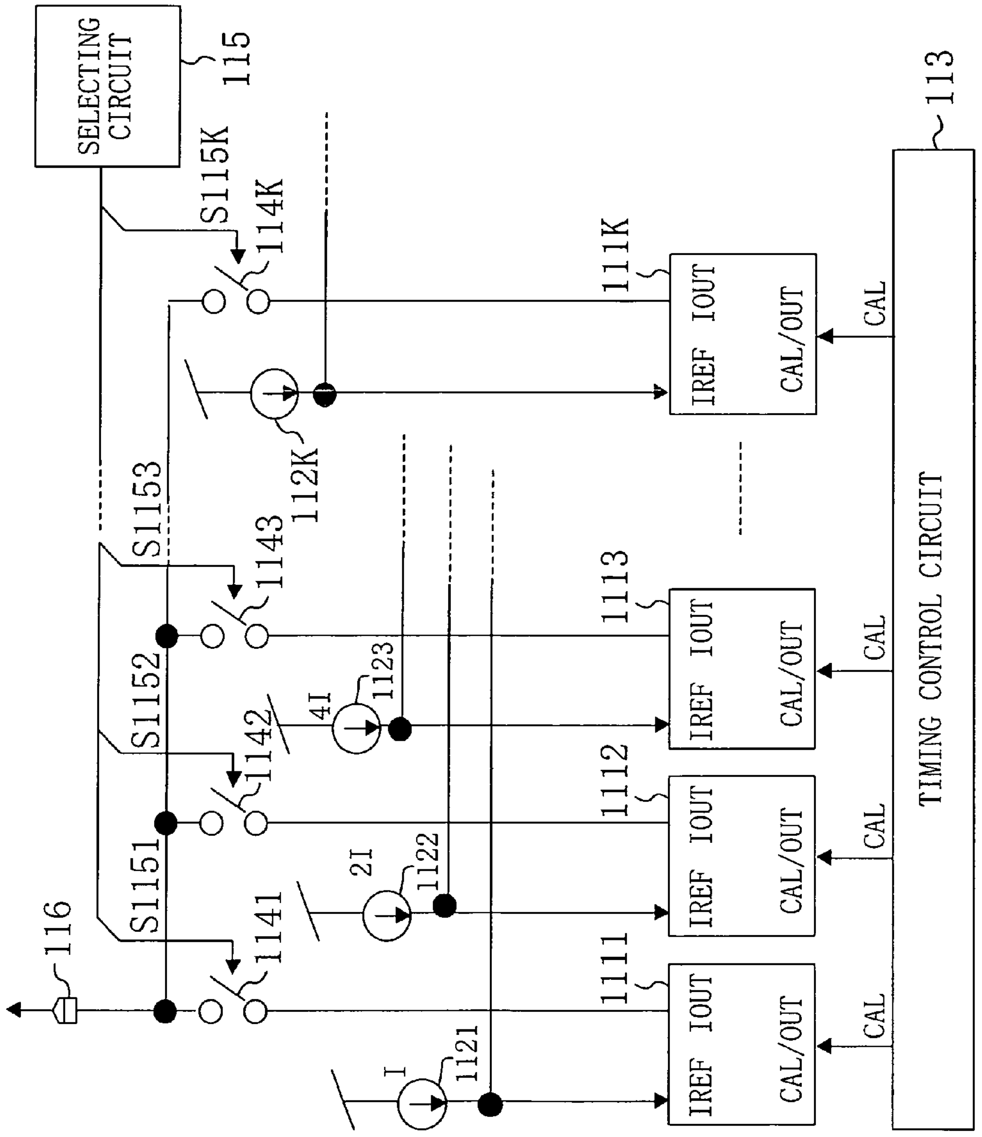
FIG. 24 is a diagram illustrating an overall configuration of a current driver according to a tenth embodiment of the present invention.
Figure 25A:
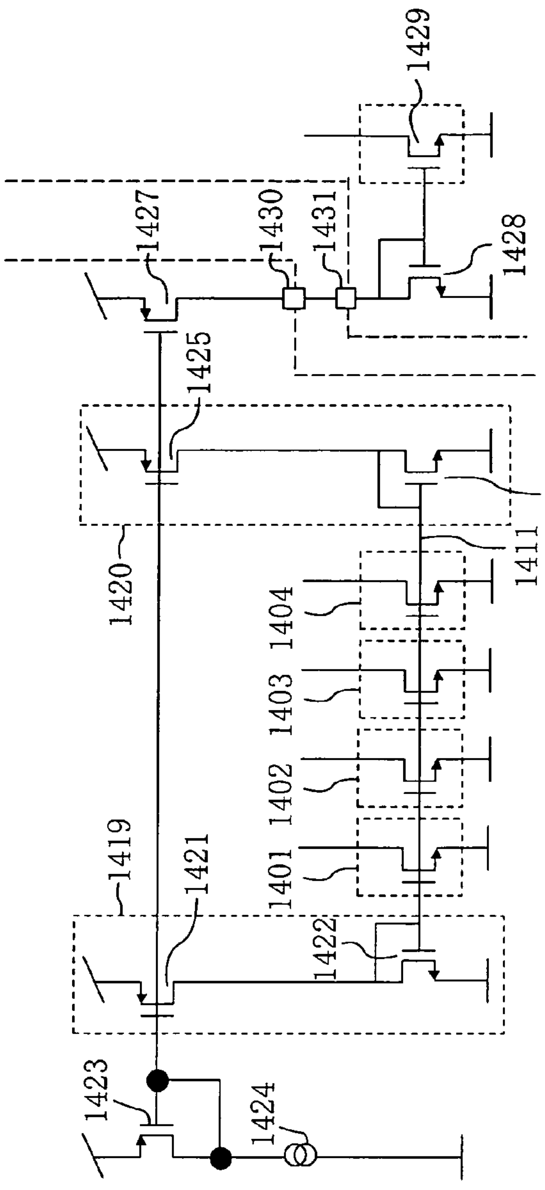
FIG. 25A is a diagram illustrating a configuration of a display driver proposed by the present inventors.
Figure 25B:
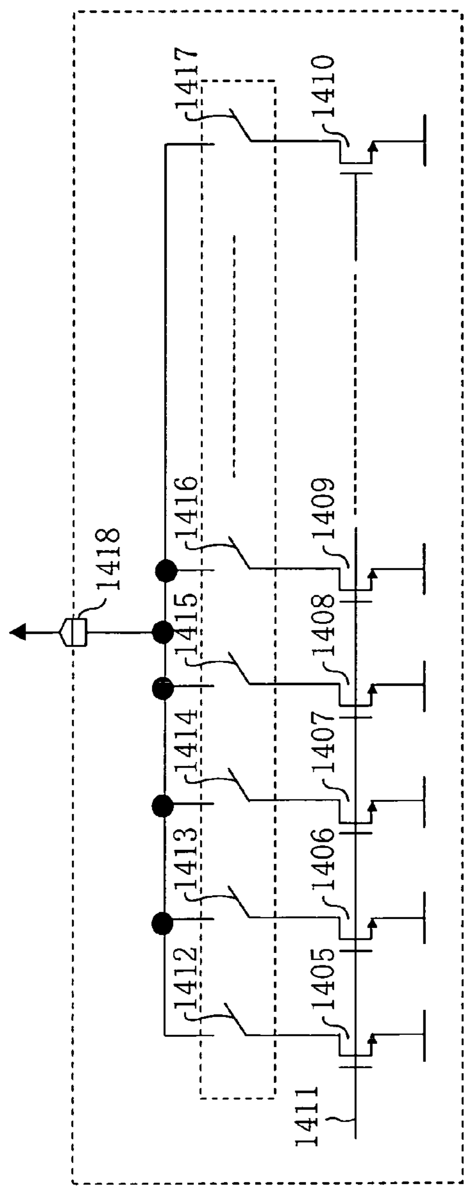
FIG. 25B is a diagram illustrating an internal configuration of a current mode D/A converter illustrated in FIG. 25A.

FIG. 24 illustrates an overall configuration of a current driver according to a tenth embodiment of the present invention. The current driver includes: K current copy circuits 1111 through 111K (where K is a natural number); K reference current sources 1121 through 112K; a timing control circuit 113; K switches 1141 through 114K; and a selecting circuit 115. Each of the current copy circuits 1111 through 111K has the configuration shown in FIG. 1B. Specifically, the current copy circuits 1111 through 111K have their current output terminals IOUT connected to the respective switches 1141 through 114K and their switching control terminals CAL/OUT connected to the timing control circuit 113. The reference current sources 1121 through 112K are connected to respective reference current input terminals IREF of the current copy circuits 1111 through 111K. Each of the reference current sources 1121 through 112K supplies a constant current having a current value of $2^{(K-1)}$I. For example, the reference current source 1121 supplies a constant current having a current value of I and the reference current source 1122 supplies a constant current having a current value of 2I. The selecting circuit 115 outputs selecting signals S1151 through S115K to the switches 1141 through 114K in accordance with display data DATA input from the outside. Each of the switches 1141 through 114K connects an associated one of the current copy circuits and a signal output terminal 116 to each other in accordance with the selecting signal from the selecting circuit 115.

<Calibration Mode>

A calibration mode of the current driver shown in FIG. 24 will be described.

The reference current sources 1121 through 112K are connected to the respective current copy circuits 1111 through 111K, so that the timing control circuit 113 is capable of outputting switching signals CAL to all the current copy circuits 1111 through 111K. Each of the current copy circuits 1111 through 111K stores a current supplied from a reference current source connected thereto, in accordance with the switching signal CAL from the timing control circuit 113.

<Output Mode>

An output mode of the current driver shown in FIG. 24 will be described.

First, the selecting circuit 115 outputs selecting signals S1151 through S115K to the switches 1141 through 114K in accordance with display data DATA input from the outside. For example, in a case where the number of levels of gray scale of display data DATA corresponds to 6 bits (N=64), if the display data DATA is "03H", the selecting circuit 115 outputs the selecting signal S1151 to the switch 1141 and outputs the selecting signal S1152 to the switch 1142.

Next, the switch 1141 connects the current output terminal IOUT of the current copy circuit 1111 and the signal output terminal 116 to each other in accordance with the selecting signal S1151 from the selecting circuit 115. The switch 1142 connects the current output terminal IOUT of the current copy circuit 1112 and the signal output terminal 116 to each other in accordance with the selecting signal S1152 from the selecting circuit 115. Accordingly the signal output terminal 116 draws a constant current (having a current value I) from the current copy circuit 1111 and a constant current (having a current value of 2I) from the current copy circuit 1112, thereby causing an output current having a current value of 3I to flow.

<Advantages>

As described above, the current values of currents from the reference current sources are set at I, 2I, 4I, . . . , so that the number of current copy circuits is reduced. Accordingly, the time for calibration and the circuit element area are reduced.

For the foregoing current mode D/A converters, configurations with which an output current is drawn from a display panel by using n-transistors are basically adopted. Alternatively, a configuration with which an output current flows to the outside may, of course, be adopted.

In a case where the output current is limited to a constant current, the same advantages are obtained.

As described above, the current drivers according to the present invention are capable of improving non-uniformity of output currents and are useful as drivers or the like for current-driven display devices for use in organic EL display apparatus.

What is claimed is:

1. A current driver switchable between a calibration mode and an output mode generating an output current according to an input signal, the current driver comprising:

R current copy circuits, where R is a natural number;

a reference current source for supplying a reference current having a given current value;

a control section; and an output current generator, wherein each of the current copy circuits stores the reference current from the reference current source in a storage state and outputs the stored reference current in an output state, wherein the control section sets, in the calibration mode, at least one of the R current copy circuits in a storage state so that the R current copy circuits are set in the storage state in sequence one by one, and sets in the output mode, all the R current copy circuits in an output state, and wherein the output current generator includes: R switches each connected between an output of each of the current copy circuits and an output node for supplying the output current; and a selector generating an output current having a current value corresponding to a value of the input signal by controlling the switches in accordance with the value of the input signal in the output mode so that the switches are turned ON/OFF.

2. The current driver of claim 1, wherein each of the current copy circuits includes:

a MOS transistor connected between a first node and a second node;

a capacitor connected between a gate of the MOS transistor and the second node;

an input terminal for receiving the current having the given value;

an output terminal; and a switch for connecting the input terminal and the first node to each other and connecting the first node and the gate of the MOS transistor to each other in the storage state and for connecting the output terminal and the first node to each other and disconnecting the first node and the gate of the MOS transistor in the output state.

3. The current driver of claim 1, further comprising:

an input terminal for receiving the current having the given current value; and an output terminal for outputting a reference current input from the input terminal to the outside, wherein each of the current copy circuits stores the current having the given current value and received from the input terminal in the storage state and outputs the stored current in the output state.

4. The current driver of claim 1, further comprising a signal transferring section for holding the input signal and outputting the input signal held therein, wherein the output current generator obtains a current or the sum of currents from a non-negative interger number of the current copy circuits selected in accordance with the input signal from the signal transferring section, and thereby generates an output current, and the control section fixes the operation mode of each of the current copy circuits at one of the storage mode and the output mode in a period during which the signal transferring section outputs no input signal.

5. The current driver of claim 4, wherein the control section fixes the operation mode of at least one of the current copy circuits at the storage mode in a period during which the signal transferring section outputs no input signal.

6. The current driver of claim 4, wherein the input signal includes an effective data portion including effective data and an ineffective data portion including no effective data, and the control section fixes the operation mode of each of the current copy circuits at one of the storage mode and the output mode while the signal transferring section holds the ineffective data portion of the input signal.

7. The current driver of claim 1, wherein the number of said current copy circuits necessary for the generation of the output current by the output current generator is N at maximum where N is a natutal number and N<R, and the output current generator obtains a current or the sum of currents from a non-negative integer number of the current copy circuits in the output mode selected in accordance with the input signal, and thereby generates an output current.

8. The current driver of claim 7, further comprising an assignment section for assigning, to the output generator, N said current copy circuits in the output mode, wherein the output current generator obtains a current or the sum of currents from a non-negative integer number of the assigned N current copy circuits selected in accordance with the input signal, and thereby generates an output current.

9. The current driver of claim 7, wherein the control section fixes the operation mode of each of at least N said current copy circuits at the output mode.

10. The current driver of claim 1, wherein each of the current copy circuits receives one of R currents inputs from the outside, the R currents have different current values, and the output current generator obtains a current or the sum of currents from a non-negative integer number of the current copy circuits selected in accordance with the input signal, and thereby generates an output current.

* * * * *